US012742797B1

(12) United States Patent
Dadoosh et al.

(10) Patent No.: US 12,742,797 B1
(45) Date of Patent: Sep. 22, 2026

(54) SYSTEM AND METHOD FOR AUTOMATIC PROBE CARD REPLACEMENT

(71) Applicant: InZiv Ltd., Jerusalem (IL)

(72) Inventors: Ori Dadoosh, Raanana (IL); Yuri Levinzon, Tel Aviv (IL); Doobie Abraham, Haifa (IL); Yuval Yohai, Rehovot (IL); Netanel Refaelovich, Eliav (IL); Matan Saydoff, Reut (IL); Yaakov Davidi, Nof Aylon (IL); Baoting Huang, Tel Aviv (IL); Andrey Ignatov, Jerusalem (IL); David Colin Chase, Jerusalem (IL)

(73) Assignee: InZiv Ltd., Jerusalem (IL)

( * ) Notice: Subject to any disclaimer, the term of this patent is extended or adjusted under 35 U.S.C. 154(b) by 0 days.

(21) Appl. No.: 19/389,717

(22) Filed: Nov. 14, 2025

(51) Int. Cl.
*G01R 1/073* (2006.01)
*G01R 1/067* (2006.01)
*G01R 3/00* (2006.01)

(52) U.S. Cl.
CPC .......... *G01R 3/00* (2013.01); *G01R 1/06716* (2013.01); *G01R 1/07342* (2013.01)

(58) Field of Classification Search
CPC ... G01R 3/00; G01R 1/06716; G01R 1/07342
See application file for complete search history.

(56) References Cited

U.S. PATENT DOCUMENTS

| | | | | |
|---|---|---|---|---|
| 5,444,386 A * | 8/1995 | Mizumura | G01R 1/07314 | 324/756.04 |
| 2009/0237098 A1* | 9/2009 | Hsu | G01R 31/01 | 324/757.03 |
| 2011/0037492 A1* | 2/2011 | Seubert | G01R 1/0491 | 324/762.01 |
| 2013/0241588 A1* | 9/2013 | Yamada | G01R 31/2601 | 324/750.24 |
| 2016/0047857 A1* | 2/2016 | Lee | G01R 31/2891 | 324/750.22 |
| 2017/0269126 A1* | 9/2017 | Liao | G01R 1/07371 | |
| 2018/0335448 A1* | 11/2018 | Belfi | G01R 1/07314 | |
| 2019/0353701 A1* | 11/2019 | Hamada | G01R 31/2887 | |
| 2024/0125817 A1* | 4/2024 | Brewer | G01R 35/005 | |
| 2024/0183895 A1* | 6/2024 | Lee | G01R 1/07314 | |
| 2024/0369623 A1* | 11/2024 | Yamaguchi | G01R 31/2834 | |
| 2025/0251443 A1* | 8/2025 | Kim | G01R 31/2867 | |

* cited by examiner

*Primary Examiner* — Dominic E Hawkins
(74) *Attorney, Agent, or Firm* — Sterne, Kessler, Goldstein & Fox P.L.L.C.

(57) ABSTRACT

A system and a method of automatically replacing a probe card used to test and inspect semiconductor devices are disclosed. The method for replacing a probe card in a test system includes using a probe card manipulator to move a used probe card from a measurement position to a replacement position, using a probe card exchanger to move the used probe card from the replacement position to a cassette, choosing a new probe card to replace the used probe card, using the probe card exchanger to move the new probe card from the cassette to the replacement position, using the probe card manipulator to engage the new probe card, and using the probe card manipulator to move the new probe card to the measurement position. The new probe card includes an array of flexible probes.

30 Claims, 10 Drawing Sheets

433
633h
633e
633f
633g 433
633a
633d
633c
633b

SYSTEM AND METHOD FOR AUTOMATIC PROBE CARD REPLACEMENT

FIELD

The present disclosure relates to semiconductor wafer testing, for example, to systems and method for automatic probe card replacement in test systems for electronic, opto-electronic, and electromechanical devices.

BACKGROUND

Electronic, optoelectronic, electromechanical, and other types of devices may be inspected and/or tested during or after fabrication and/or assembly. Testing is particularly important for eliminating defective and non-conforming devices early in the manufacturing process, which ultimately improves the quality of end-products and reduces costly customer returns.

BRIEF DESCRIPTION OF THE DRAWINGS

Aspects of this disclosure are best understood from the following detailed description when read with the accompanying figures.

Illustrative aspects will now be described with reference to the accompanying drawings. In the drawings, like reference numerals generally indicate identical, functionally similar, and/or structurally similar elements.

DETAILED DESCRIPTION

Figure 1:
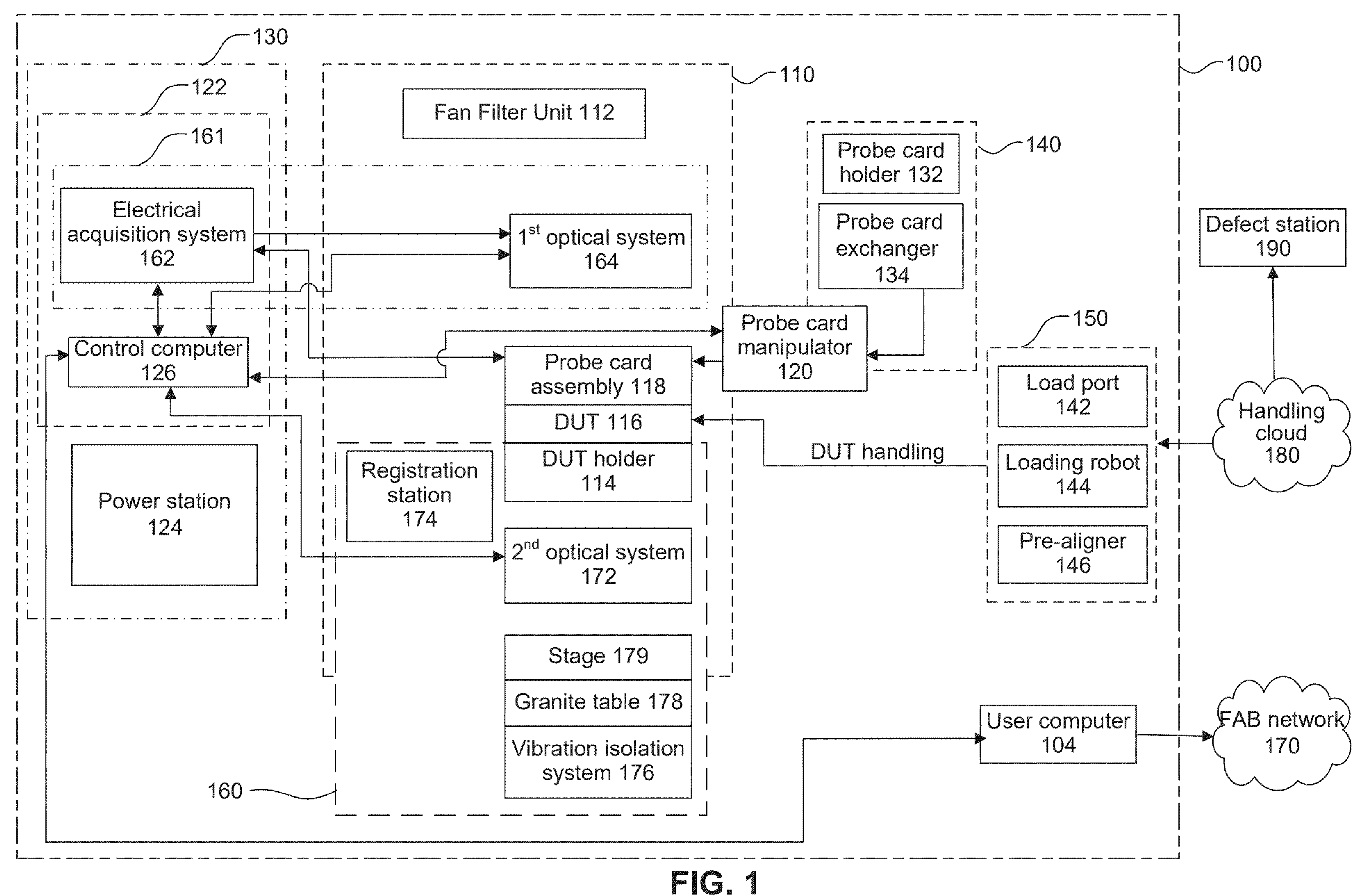
FIG. 1 illustrates a block diagram of a test system, according to some aspects.

The following disclosure provides many different aspects, embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include aspects in which the first and second features are formed in direct contact, and may also include aspects in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various aspects and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one aspect," "an aspect," "an example aspect," "exemplary," etc., indicate that the aspect described may include a particular feature, structure, or characteristic, but every aspect may not necessarily include the particular feature, structure, or characteristic. Moreover, such phrases do not necessarily refer to the same aspect. Further, when a particular feature, structure or characteristic is described in connection with an aspect, it would be within the knowledge of one skilled in the art to effect such feature, structure or characteristic in connection with other aspects whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some aspects, the terms "about," "approximately," and "substantially" can indicate a value of a given quantity that varies within 5-20% of the value (e.g., ±1%, ±2%, ±3%, ±4%, ±5%, ±10%, ±10-15%, ±15~20% of the value). These values are merely examples and are not intended to be limiting. The terms "about" and "substantially" can refer to a percentage of the values as interpreted by those skilled in relevant art(s) in light of the teachings herein.

Semiconductor devices, such as electronic, optoelectronic, electromechanical and other types of devices can be formed in a one or two-dimensional array on a wafer or other surfaces for evaluation to ensure their functionality, performance, and/or compliance with specifications. Such a platform containing devices for evaluation can be referred to as a device under test (DUT). Evaluation methods can include testing each of the devices in an array in parallel (i.e., simultaneously) by applying parallel (i.e., simultaneous) electrical, electrochemical, optical, and/or other such excitations to the devices in the array. These parallel excitations can produce a variety of signals, such as emission values from the devices, which can be detected and/or sensed in parallel (i.e., simultaneously). Such parallel and high-throughput testing of semiconductor devices in consumer electronics can be beneficial, as a DUT in consumer electronics can have millions of individual devices for testing. Detecting defects as early as possible in the device fabrication process can prevent costly yield losses at higher assembly levels, and a high test throughput can further enable substantial product cost reductions.

Some test methods can utilize replaceable, two-dimensional test probe arrays in a probe card customized to each DUT, but such test probe arrays can be limited in use. Also, the stiff probes in some test probe arrays can leave "scrub marks" on each device test pad of the DUT, damaging both the device test pads and the probes themselves each time they come in contact with the device test pads. Such two-dimensional test probe arrays are often large in order to match the size of each DUT, limiting the number of probe arrays can be stored in a cleanroom space that is both costly and finite. Even in test methods which include automated replacement of damaged and/or worn-out probe cards, a high rate of probe wear combined with a small number of large, two-dimensional replacement probe cards in storage can result in significant equipment downtime and more frequent human intervention. Moreover, even in cases where replaceable probe cards are smaller, the test systems and methods may not be well-optimized for fully-automated replacement and calibration of the probe cards, relying on unreliable electro-mechanical connections and cabling incompatible with robotic movement.

One exemplary testing modality is electrical excitation of a device, which imposes a voltage or current to a probe that is in electrical communication with the device. Typically, in this example, the device and the probe are part of the same circuit, and the imposition of the current/voltage is to drive excitation of the device to produce a variety of signals, such as emission values. These signals can then be monitored or sensed optically and/or electrically and recorded for analysis. A device subjected to such testing can be referred to as a device under test (DUT). High-throughput and high yield testing of a DUT is desirable because both throughput and yield have a direct impact on device cost. Such high-throughput and high yield testing requires a high degree of testing automation, minimization of test equipment downtime, and minimization of damage to both DUT and probe, which current test systems are unable to adequately achieve.

One constraint on realizing a high-throughput, low-downtime test system is the replacement of probe devices. In some cases, test systems may use a probe card comprising an array of flexible probes that contact a DUT. Due to the movement of the flexible probes along the surface of the DUT, one or more of the flexible probes may wear out, requiring replacement of the used probe card. Alternatively, a used probe card may be replaced when a new probe card with different parameters is required for testing a new DUT.

In conventional test systems, a new probe card must be retrieved from outside of the test system and loaded into the test system for use. However, having the probe card storage located external to the test system may cause safety concerns when a user enters the operating area of the test system, and safety protocols may require shutting down the test system when a user enters the operating area, thereby increasing system downtime.

Accordingly, there is a need for a technique to automatically replace a used probe card in a test system without increasing system downtime. For example, probe card replacement in a test system can be performed faster and with less downtime based on aspects described herein. In addition, there is a need for a probe card system that forms a closed system that requires less user maintenance and that reduces the chance of user error leading to significant system downtime.

To address the above-mentioned challenges, the present disclosure provides example test systems and methods for testing DUTs at a high rate of throughput and with a high degree of automation. The example test systems and methods can provide substantial time- and cost-savings to the manufacture of devices, while increasing maintenance intervals and thus reducing test system downtime.

In some aspects herein, DUTs can include discrete devices, arrays of devices, or a combination thereof. In some aspects herein, DUTs can include intact wafers of devices, singulated wafers of devices, or singulated devices disposed on wafer hoops, wafer rings, or other intermediate device carrier structures. In some aspects, the individual devices of DUTs can be micro light-emitting diode (also known as "microLED" or "μLED") devices. In other aspects, the individual devices of DUTs may be organic light-emitting diode (OLED) devices, laser devices, photodiode devices, or other optoelectronic devices. In other aspects, the individual devices of DUTs can be electronic semiconductor devices, or micro-electro-mechanical systems (MEMS).

In some aspects, a method for replacing a probe card in a test system may comprise moving, by a manipulator, a used probe card from a measurement position to an exchange position, moving, by a probe card exchanger, the used probe card from the exchange position to a cassette, choosing a new probe card to replace the used probe card, moving, by the probe card exchanger, the new probe card from the cassette to the exchange position, engaging, by the manipulator, the new probe card, and moving, by the manipulator, the new probe card to the measurement position. The new probe card may comprise an array of flexible probes.

In some aspects, a probe card replacement station may comprise a drawer unit containing a cassette of probe cards, a probe card exchanger configured to transfer probe cards from the cassette to a manipulator, and a controller configured to choose, from the cassette, a new probe card to replace a used probe card. The new probe card may comprise an array of flexible probes.

In some aspects, a test system may comprise a manipulator configured to move between a measurement position for measuring a wafer and an exchange position for exchanging probe cards, a drawer unit containing a cassette of probe cards, a probe card exchanger configured to transfer probe cards from the cassette to the manipulator, and a controller configured to choose, from the cassette, a new probe card to replace a used probe card. The new probe card may comprise an array of flexible probes.

In some aspects, a registration plate for a test system may comprise a plurality of roll alignment pads configured to check a roll alignment and a yaw alignment of a probe card, and a plurality of integrity test pads configured to check an x-axis alignment and a y-axis alignment of the probe card. The probe card may comprise an array of flexible probes. Thus, in some aspects, the registration plate may be capable of testing and/or calibrating each individual probe of the array of flexible probes.

FIG. 1 illustrates a block diagram of a test system 100 configured for high-throughput testing of DUTs, according to some aspects. In some aspects, test system 100 may be configured to be compatible with cleanroom environments and high degrees of automation, such that particle emissions can be kept to a minimum, DUT loading and unloading can be partly- or fully-automated, and/or all subsystems and components can be readily serviceable. In some aspects, test system 100 can be contained within an external enclosure.

According to some aspects, test system 100 can include a user computer 104, a metrology station 110, a probe card manipulator 120, an electrical station 130, a replacement station 140, an equipment module 150, and a prober 160. User computer 104 can be connected to a fab network 170 via a communications interface, in accordance with some aspects. One example of communications between the components of test system 100 is illustrated by arrows, as shown in FIG. 1. In some aspects, communications between components of test system 100 without a directly illustrated connection can be enabled via transitive connections.

In some aspects, metrology station 110 may include a collection of equipment for testing a DUT 116, and can include equipment either in direct contact with DUT 116 or in close proximity to DUT 116. In some aspects, metrology station 110 can be positioned in the center of test system 100. In some aspects, metrology station 110 can include a fan filter unit 112, a first optical system 164, and a probe card assembly 118. In some aspects, metrology station 110 may also include prober 160 in its entirety. In other aspects, metrology station 110 can include only a portion of prober 160.

In some aspects, fan filter unit 112 may be configured to exhaust air from test system 100 into its surrounding environment and/or intake air from the surrounding environment into test system 100. In some aspects, fan filter unit 112 can include an air filter to limit particulate matter from entering test system 100 and/or its surrounding environment. In some aspects, first optical system 164 may include lenses, one or more camera systems, and/or optical spectrometers (not shown) and may be configured to detect optical signals emitted from DUT 116. In some aspects, first optical system 164 can further include illumination sources, such as LED and laser sources. In some aspects, probe card assembly 118 can be configured to perform tests on DUT 116. During the testing of DUT 116, probe card assembly can be brought into physical contact with DUT 116, and can be configured to apply a bias.

In some aspects, probe card manipulator 120 can be configured to manipulate probe card assembly 118, which can be attached to probe card manipulator 120. Probe card manipulator 120 can be configured to move probe card assembly 118 between at least two positions: DUT 116 (e.g., a measurement position) and replacement station 140 (e.g., a replacement position). In some aspects, probe card manipulator 120 can be physically positioned between metrology station 110 and replacement station 140. In some aspects, probe card manipulator 120 may be manipulated (e.g., rotated) to transfer probe card assembly 118 from metrology station 110 to a location near a registration plate (e.g., a registration position). In some aspects, probe card manipulator 120 may be manipulated (e.g., rotated) to transfer probe card assembly 118 from metrology station 110 to a location near replacement station 140 for probe card assembly 118 to be grabbed by a probe card exchanger 134. In some aspects, probe card exchanger 134 may be referred to as "an automated multi-axis robotic system 134," "a robotic system 134," or "a robotic arm 134" in replacement station 140.

In some aspects, probe card manipulator 120 can be connected to probe card exchanger 134 and probe card assembly 118 via a communications interface. In some aspects, probe card manipulator 120 can actuate with six degrees of freedom. Actuators driving probe card manipulator 120 can include direct-drive actuators, stepper motors, brushed and brushless DC motors, DC servo actuators, voice coil actuators, modular piezoelectric actuators, screw piezoelectric actuators, inertia piezoelectric actuators, vacuum-compatible piezoelectric actuators, amplified piezoelectric actuators, or a combination thereof.

In some aspects, electrical station 130 can be configured to provide power to the test system 100, control various functions of test system 100 via communications interfaces, and/or acquire electrical signals during the testing of DUT 116. Electrical station 130 can be positioned adjacent to metrology station 110 to enable shorter communications links and minimize electrical signal interferences and cross-talk. In some aspects, electrical station 130 can include a utility station 122 and a power station 124. Utility station 122 can include an electrical acquisition system 162 and a control computer 126. Electrical acquisition system 162 can be connected to first optical system 164 and probe card assembly 118 via a communications interface. Control computer 126 can be connected to electrical acquisition system 162, first optical system 164, second optical system 172, and user computer 104 via a communications interface. In some aspects, electrical acquisition system 162 and first optical system 164 are collectively referred to as acquisition system 161.

In some aspects, replacement station 140 can be configured to replace a probe card in probe assembly 118 used by metrology station 110. Replacement station 140 may be positioned adjacent to metrology station 110 to minimize the travel distance of probe cards between metrology station 110 and replacement station 140 during the probe card replacement process. In some aspects, replacement station 140 may include a probe card holder 132 and probe card exchanger 134. In some aspects, probe card holder 132 may be configured to store a total of about 50 or more probe cards, including used probe cards, new probe cards, and/or dummy probe cards configured to test one or more electrical or mechanical components of test system 100. In some aspects, probe card exchanger 134 may be one of a robotic arm, one or more linear actuators, and a conical connection. In some aspects, probe card exchanger 134 may actuate with six degrees of freedom. Actuators driving robotic arm 134 may include direct-drive actuators, stepper motors, brushed and brushless DC motors, DC servo actuators, voice coil actuators, modular piezoelectric actuators, screw piezoelectric actuators, inertia piezoelectric actuators, vacuum-compatible piezoelectric actuators or amplified piezoelectric actuators.

In some aspects, equipment module 150 may store DUTs, such as DUT 116 prior to testing and/or after testing of DUT 116 is complete. Equipment module 150 may be positioned adjacent to metrology station 110 in order to minimize travel distance of DUT 116 between metrology station 110 and equipment module 150 during the testing of DUT 116. In some aspects, equipment module 150 may include a load port 142, a loading robot 144, and a pre-aligner 146. Load port 142 may be configured to store DUTs, pre-aligner 146 may be configured to position DUTs such that they are oriented correctly for insertion into metrology station 110, and loading robot 144 may be configured to transfer DUT 116 between load port 142 and DUT holder 114 in DUT prober 160. In some aspects, equipment module 150 can be connected to a handling cloud 180 via a communications interface and can be connected to a defect station 180 through handling cloud 190.

In some aspects, DUT prober 160 may provide a stable, low vibration physical base on which DUT 116 can be disposed. DUT prober 160 may be located entirely within, or partly within, metrology station 110. DUT prober 160 may include a DUT holder 114 configured to hold DUT 116 during the testing of DUT 116, a second optical system 172 positioned below DUT holder 114, a stage 179 positioned below second optical system 172, and in physical contact with DUT holder 114, a table 178 positioned below stage 179 and in physical contact with stage 179, a vibration isolation system 176 in physical contact with table 178, and a registration station 174. In some aspects, vibration isolation system 176 may be in direct contact with a floor of the location where test system 100 is located. In some aspects, vibration isolation system 176 may be disposed between table 178 and stage 179, and table 178 may be in direct contact with a floor of the location where test system 100 is located.

Within some aspects, DUT holder 114 may be configured to hold DUT 116 via a vacuum release system, a mechanical latch, or electrostatic forces, among other aspects. Second optical system 172 may include lenses, one or more camera systems, and/or optical spectrometers (not shown) and may be configured to detect optical signals emitted from DUT 116. In some aspects, second optical system 172 may further include illumination sources, such as LED and laser sources. Stage 179 may be configured to translate in- and out-of plane, as well as rotate in-plane, to enable accurate placement of DUT 116 relative to probe card assembly 118 prior to testing DUT 116, and/or may be configured to move relative to probe card assembly 118 during testing of DUT 116. The table 178 and vibration isolation system 176 in combination can minimize the impact of environmental vibrations on measurements of DUT 116.

In some aspects, DUT 116 may include discrete devices, arrays of devices, or a combination thereof. In some aspects, DUT 116 may include intact wafers of devices, singulated wafers of devices, or singulated devices disposed on wafer hoops, wafer rings, or other intermediate device carrier structures. In some aspects, the individual devices of DUT 116 may be micro light-emitting diode (microLED) devices. In other aspects, the individual devices of DUT 116 may be organic light-emitting diode (OLED) devices, laser devices, photodiode devices, or other optoelectronic devices. In other aspects, the individual devices of DUT 116 may be electronic semiconductor devices, or micro-electro-mechanical systems (MEMS).

Figure 2:
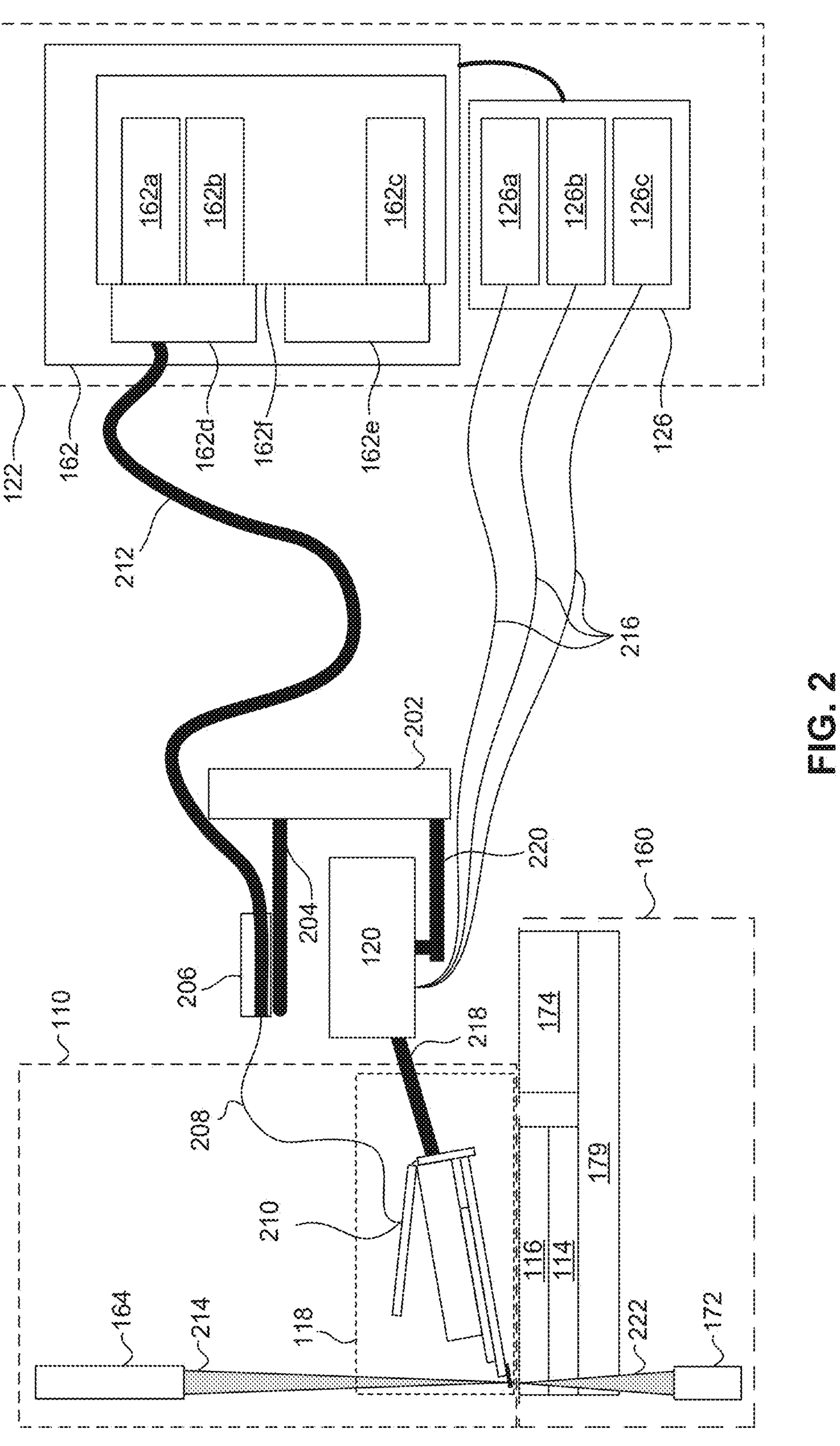
FIG. 2 illustrates schematics of a metrology station and an electrical station of a test system, according to some aspects.

FIG. 2 illustrates schematics of metrology station 110, probe card manipulator 120, utility station 122, and DUT prober 160 of test system 100, and additional components of test system 100 omitted for simplicity from FIG. 1. The discussion of elements in FIGS. 1 and 2 with the same annotations applies to each other, unless mentioned otherwise. In some aspects, metrology station 110 may include probe card assembly 118, which may be positioned above stage 179, DUT holder 114, DUT 116, and registration station 174. In some aspects, a top surface of registration station 174 may be substantially coplanar with a top surface of DUT 116.

Referring to FIG. 2, in some aspects, probe card assembly 118 may be attached to probe card manipulator 120 via a manipulator arm 218. Probe card manipulator 120 may be physically supported by a manipulator support 220, which may be physically supported by a bridge 202. Bridge 202 may be mechanically affixed to a stationary portion of metrology station 110. Probe card manipulator 120 may be connected to control computer 126 via a set of control cables 216. Control computer 126 may include a yaw controller **126*a*, a roll controller 126*b*, and an XYZ controller 126*c*, each of which may control a respective motion of probe card manipulator 120**.

Control computer 126 may be connected via a communications interface to electrical acquisition system 162. In some aspects, electrical acquisition system 162 can include a DSUB (D-subminiature) connector **162*d*, a trigger adapter 162*e*, and a chassis 162*f*. Chassis 162*f* may include a signal measurement unit (SMU) 162*a*, an SMU 162*b*, and a triggers card 162*c*. Though two SMUs shown in FIG. 2, electrical acquisition system 162 may have any number of SMUs. Both SMU 162*a* and 162*b* may be connected to DSUB connector 162*d* via a communications interface and triggers card 162*c* may be connected to trigger adapter 162*e* via a communications interface. Triggers card 162*c* may be configured to emit and/or receive trigger signals provided to and/or received from SMU 162*a* or SMU 162*b*. In order to support a high testing throughput, in some aspects, the entire electrical path from DUT 116 through DSUB connector 162*d* may support at least 64 independent measurement channels. In some aspects, SMU 162*a* and SMU 162*b* may be replaced with a custom multi-voltage driver configured to apply a plurality of predefined voltages to DUT 116** and measures a current at each predefined voltage.

In some aspects, probe card assembly 118 may be electrically connected to SMU **162*a* and/or SMU 162*b* through DSUB connector 162*d* via a soldered wire 210, a spread wire 208, and a shielded cable 212. In some aspects, a bias may be applied to DUT 116 from SMU 162*a* and/or SMU 162*b* through probe card assembly 118 and a current can be measured. In some aspects, a current can be applied to DUT 116 from SMU 162*a* and/or SMU 162*b* through probe card assembly 118 and a bias can be measured. In some aspects, shielded cable 212 may be physically supported by a cable chain 206 and cable chain 206 may be physically supported by a cable holder 204, which may be physically supported by bridge 202**.

In some aspects, DUT 116 may emit an optical signal 214 in response to an electrical excitation received via probe card assembly 118. The emitted optical signal 214 can be substantially normal to a top surface of DUT 116 within an angular cone and can be detected by first optical system 164. In some aspects, DUT 116 can also emit an optical signal 222 in response to an electrical excitation received via probe card assembly 118. The emitted optical signal 222 can be substantially normal to a bottom surface of DUT 116 within an angular cone and may be detected by second optical system 172. In some aspects, optical signals 214 and 222 may include reflected illumination originating from first optical system 164 or second optical system 172. In some aspects, optical signals 214 and 222 may be emitted in the form of electroluminescence, which can be generated from DUT 116 in response to an electrical excitation applied to DUT 116 via probe card assembly 118. In some aspects, optical signals 214 and 222 may be emitted in the form of photoluminescence, which can be generated from DUT 116 in response to an optical excitation applied to DUT 116 from illumination sources in either first optical system 164 or second optical system 172. In some aspects, optical signals 214 and 222 may include a combination of reflected illumination, electroluminescence, and/or photoluminescence.

Figure 3:
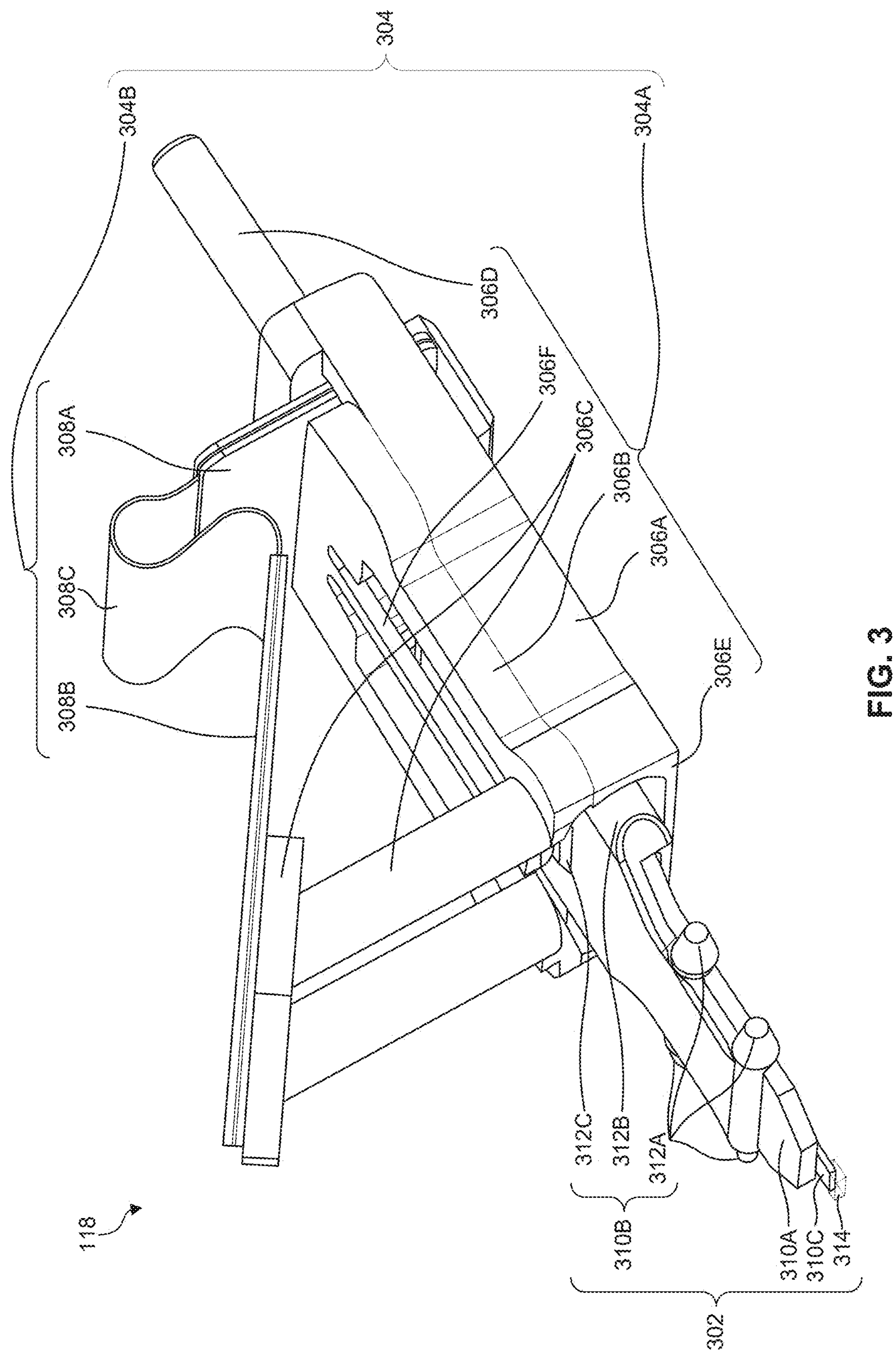
FIG. 3 illustrates a perspective view of a probe card assembly of a test system, in accordance with some aspects.

FIG. 3 illustrates a perspective view of probe card assembly 118 of test system 100, according to some aspects. Referring to FIG. 3, in some aspects, probe card assembly 118 may include a probe card 302 and a probe receptacle 304, which may include a receptacle holster 304A and a receptacle printed circuit board (PCB) assembly 304B. In some aspects, receptacle PCB assembly 304B may be a rigid-flex-rigid PCB assembly 304B.

In some aspects, probe receptacle 304 may be configured to hold probe card 302. Probe receptacle 304 may provide an electromechanical interface for the attachment of probe card 302 through its components—receptacle holster 304A and receptacle PCB assembly 304B. Receptacle holster 304A may be configured to hold probe card 302 and provide mechanical support for probe card 302, while receptacle PCB assembly 304B can provide electrical interface to probe card 302. The components of receptacle holster 304A may be composed of metal and/or metal alloys, including aluminum, stainless steel, or titanium, among other potential materials. In some aspects, receptacle holster 304A may include a holster base 306A, a holster lid 306B fastened to holster base 306A, a holster platform 306C fastened to holster lid 306B, a receptacle shaft 306D protruding from holster base 306A, and a rail guide 306E. In some aspects, holster lid 306B may include a holster clip 306F, which may be configured to hold probe card 302 in position after being inserted into receptacle holster 304A. Receptacle shaft 306D can mechanically attach receptacle holster 304A to manipulator arm 218 of probe card manipulator 120 during the manipulation of probe card assembly 118 as discussed above. Rail guide 306E may include a tapered opening to aid in the insertion of probe card 302 into receptacle holster 304A, effectively relaxing the need for placement accuracy of probe card exchanger 134 during the insertion of probe card 302 into receptacle holster 304A.

In some aspects, receptacle PCB assembly 304B may be attached to spread wire 208 via soldered wire 210 (not shown), through which an electrical signal can be provided to probe card 302. Receptacle PCB assembly 304B may include a first receptacle PCB 308A, a second receptacle PCB 308B, and a ribbon cable 308C. First receptacle PCB 308A may be attached to a first end of ribbon cable 308C and second receptacle PCB 308B may be attached to a second end of ribbon cable 308C. One end of first receptacle PCB 308A may be attached to holster platform 306C and another end of first receptacle PCB 308B may be attached to ribbon cable 308C.

According to some aspects, probe card 302 may provide a mechanically stable platform for transporting electrical signals from DUT 116 to receptacle PCB assembly 304B during the testing of DUT 116. In order to maximize the number of probe cards 302 which fit in probe card holder 132, probe card volume may be minimized. In some aspects, probe card 302 may be limited to a total volume of 33 $cm^3$, which may enable up to 50 probe cards 302 to fit in some aspects of probe card holder 132. Other total volumes and probe card capacities are also possible, and are within the spirit and scope of the disclosed system. In order to reduce wear and maintenance costs on probe card exchanger 134 and/or probe card manipulator 120, probe card 302 mass may be kept to a minimum. For aspects in which actuation of probe card exchanger 134 and/or probe card manipulator 120 is driven via a piezoelectric-type actuator, probe card 302 may be limited to a maximum mass of about 100 g, for example, so as not to damage the piezoelectric elements. Other values of maximum masses are also possible, and are within the spirit and scope of the disclosed system.

In some aspects, probe card 302 may include a probe PCB 310A, a PCB jacket 310B attached to probe PCB 310A, and a probe array chip 310C. PCB jacket 310B may be wrapped around the sidewalls of probe PCB 310A. In some aspects, PCB jacket 310B may be composed of polyetheretherketone (PEEK) or polyetherketoneketone (PEKK), among other potential materials, to minimize the weight of probe card 302 while maintaining mechanical strength and cleanroom compatibility via low particulate generation. In some aspects, PCB jacket 310B may include a set of jacket attach points 312A (also referred to as “grab points 312A”), a set of jacket rails 312B, and a clip bump 312C. Jacket attach points 312A may have a tapered conical structure that extend outwards from sidewalls of PCB jacket 310B. Jacket attach points 312A may be used as grab points by probe card exchanger 134 to securely hold probe card 302 during the transportation of probe card 302 between probe card holder 132 and probe card manipulator 120. In some aspects, jacket attach points 312A may be replaced with PCB attach points formed in the PCB (not shown), and PCB attach points may be used as grab points by probe card exchanger 134 to securely hold probe card 302 during transportation of probe card 302 between probe card holder 132 and probe card manipulator 120. Jacket rails 312B may be positioned on sidewalls of probe PCB 310A and may assist probe card 302 to slide along the tapered opening of rail guide 306E with ease during the insertion of probe card 302 into receptacle holster 304A. Clip bump 312C may provide a raised region for holster clip 306F to hold down probe card 302 in place after being inserted into probe receptacle 304.

In some aspects, probe array chip 310C may be a MEMS chip, which may include a flexible probe array 314 for making contact with DUT 116. Probe array chip 310C may be attached to probe PCB 310A with a mechanically robust material such as an epoxy, with electrical connections between probe array chip 310C and probe PCB 310A formed with wire bonding. In some embodiments, probe array chip 310C may be attached to probe PCB 310A with flip-chip bonding.

Probe array chip 310C may include a probe array 314, which can include a one-dimensional array of flexible probes that can flex or bend on physical contact with DUT 116 during the testing of DUT 116. The configuration (e.g., pitch and geometry) of the flexible probes in probe array 314 may be aligned with the layout configuration of the individual devices of DUT 116. In some aspects, each of the flexible probes in probe array 314 may be formed of a conductive and flexible material. In some embodiments, each of the flexible probes in probe array 314 may be formed of a metal, silicon, silicon nitride, a polymer, silicon coated with gold or other conductive material, silicon nitride coated with a conductive material, a polymer coated with a conductive material, or other suitable conductive and flexible materials.

Figure 4:
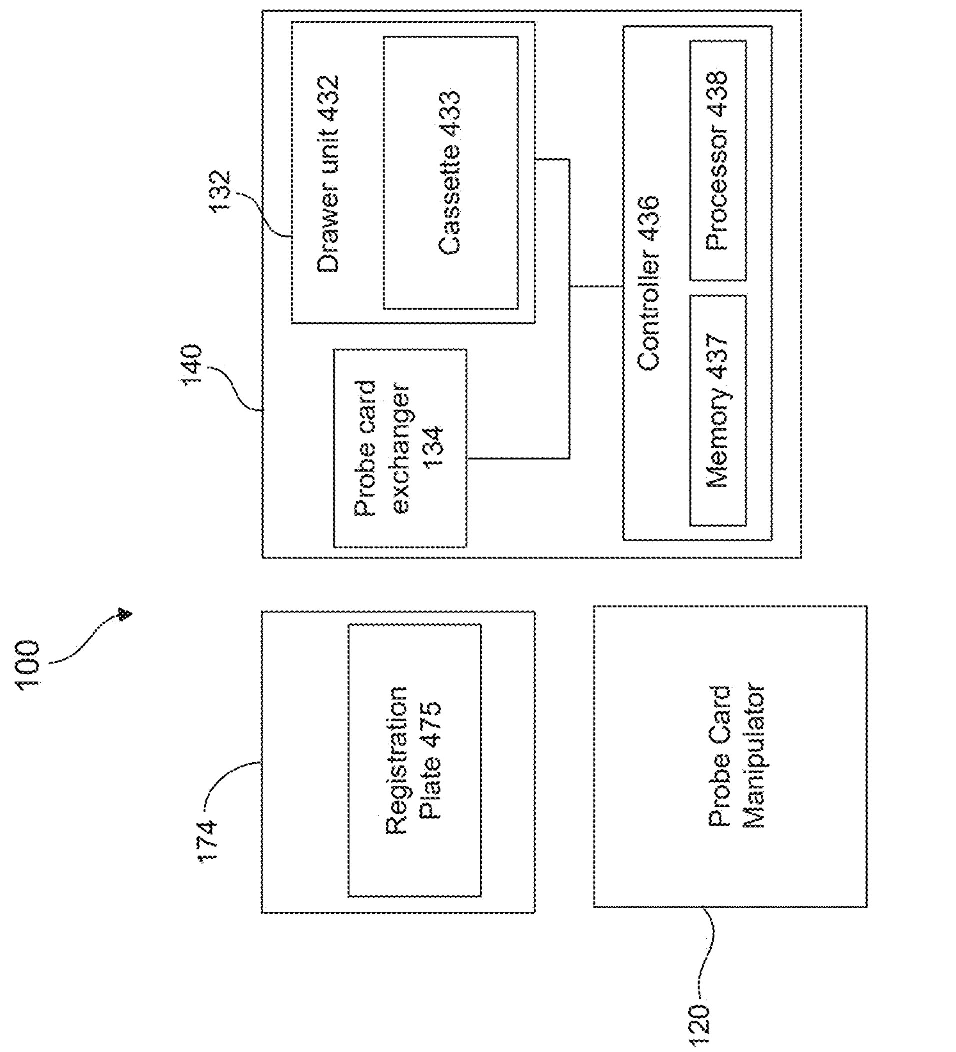
FIG. 4 illustrates schematics of a test system configured for automatic replacement of probe cards in a probe card assembly, according to some aspects.

FIG. 4 shows a schematic illustration of test system 100 configured for automatic replacement of probe cards, according to some aspects. According to some aspects, test system 100 may include probe card manipulator 120, registration station 174, and probe card replacement station 140. Within some aspects, test system 100 may also include components and/or devices not shown in FIG. 4.

Within some aspects, probe card manipulator 120 may be configured to engage a probe card (e.g., probe card 302) and move the probe card at least between a measurement position with respect to a DUT on a wafer and a replacement position away from the DUT. In some aspects, probe card manipulator 120 may also be configured to move a probe card to a registration position.

Figures 5A, 5B:
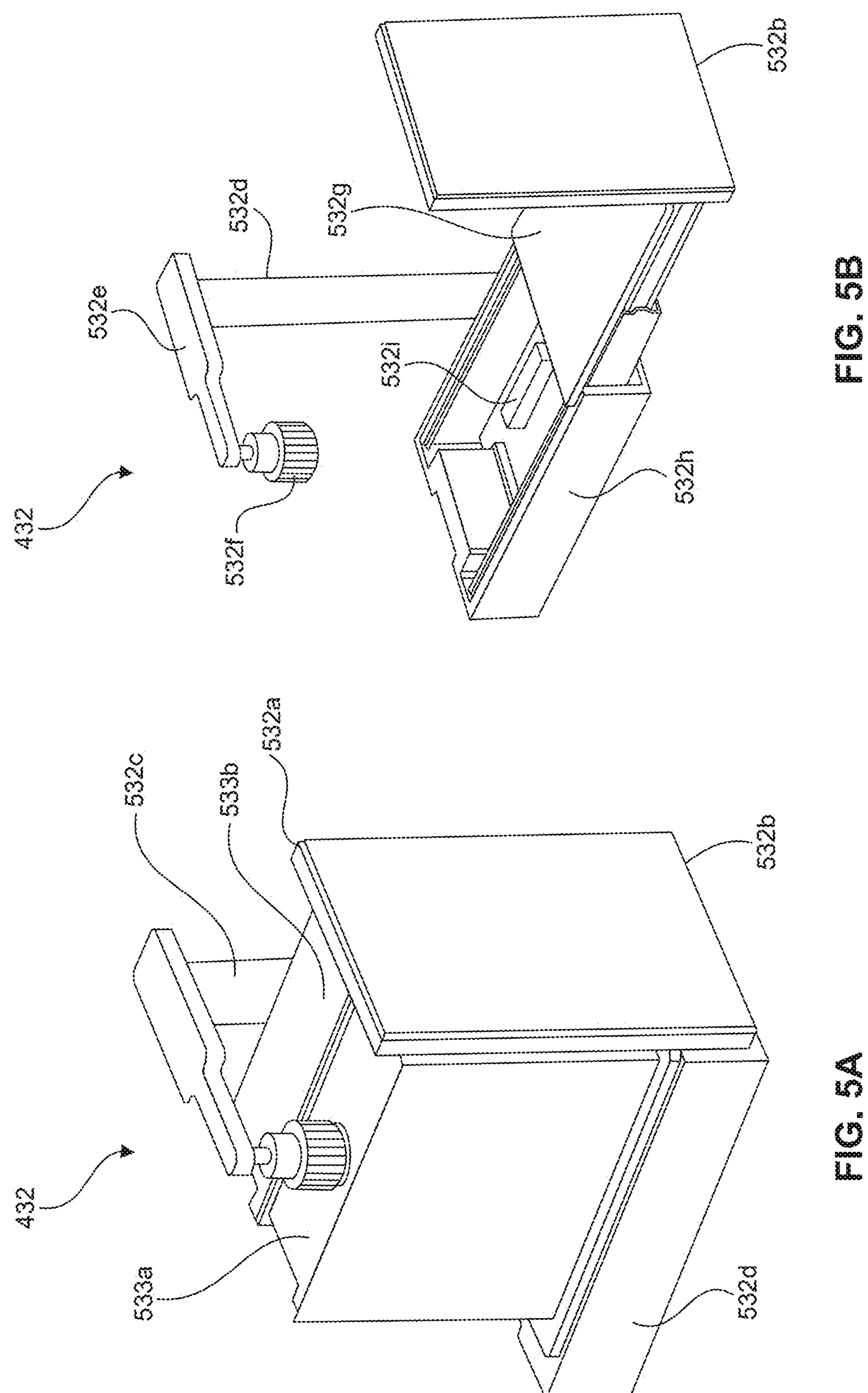
FIGS. 5A and 5B illustrate perspective views of a drawer unit of a probe card replacement station of a test system, according to some aspects.

According to some aspects, in addition to probe card exchanger 134, probe card replacement station 140 may include a drawer unit 432 configured to hold a one or more cassettes 433 of probe cards (e.g., probe card 302), and a controller 436. In some aspects, drawer unit 432 may include more than one cassette 433 (e.g., active cassette 533*a* and one or more spare cassettes 533*b*, as shown in FIG. 5A). More details of drawer unit 432 and cassette 433 are discussed below with regard to FIGS. 5A, 5B, 6A, and 6B.

According to some aspects, probe card exchanger 134 may be configured to transfer probe cards between probe card manipulator 120 and cassette 133. Within some aspects, probe card exchanger 134 may comprise, for example, a robotic arm, one or more linear actuators, or a conical connections.

In some aspects, controller 436 may be disposed within probe card replacement station 140. In some aspects, controller 436 may be remote from probe card replacement station 140. For example, in some aspects, controller 436 may be control computer 126 or user computer 140. Within some aspects, controller 436 may comprise a memory 437 and a processor 438. As non-limiting examples, memory 437 may comprise a computer-readable non-transitory media such as a flash memory, a read-only memory (ROM), a random access memory (RAM), a phase-change memory (PCM), a magnetoresistive RAM (MRAM), a non-volatile RAM (NVRAM), or the like. In some aspects, memory 437 may be implemented as one or more of a universal serial bus (USB) drive, a memory card, a solid state drive (SSD), a hard disc drive (HDD), a compact disc drive (CD), or the like. In some aspects, processor 438 may be implemented as a hardware processing unit, such as a central processing unit (CPU), or as a subunit of a hardware processing unit, or as a software implemented processing unit. In some aspects, one or both of memory 437 and processor 438 may be disposed remotely from controller 436, for example, in a cloud computing environment. According to some aspects, non-transitory memory 437 may include a set of instructions, and processor 438 may be configured to receive and execute instructions from non-transitory memory 437. Upon receiving instructions from non-transitory memory 437, processor 438 may be configured to execute one or more steps, operations, or processes.

According to some aspects, registration station 174 may include one or more registration plates 475. Within some aspects, a registration plate 475 may be configured to test probe card 302. In some aspects, a new probe card may be tested during replacement to determine that the new probe card is fully functional. In some aspects, a used probe card may be tested to determine if all of the probes in the used probe card are working properly. In some aspects, a used probe card may be tested to determine one or more malfunctions of the used probe card.

As used herein, the terms "new probe card" and "used probe card" relate only to probe card currently being used by the test system and do not indicate an overall status of the probe card. For example, a "new probe card" may be a probe card that has been used previously but has been stored in cassette 433 during usage of the "used probe card." Thus, the term "used probe card" merely refers to the most recently used probe card that is being removed from test system 100 within some aspects and being replaced by another probe card. The discussion above of probe card 302 applies to the new probe card and the used probe card, unless mentioned otherwise.

FIGS. 5A and 5B show perspective views of drawer unit 432 according to some aspects. Within some aspects, drawer unit 432 may include a case 532*a*, at least one panel 532*b*, and a cassette opening mechanism 532*c*. FIG. 5A shows a view of drawer unit 432 including two cassettes 433 (e.g., active cassette 533*a* and spare cassette 533*b*). FIG. 5B shows a view of drawer unit 432 omitting cassettes 433 to show additional elements of drawer unit 432.

According to some aspects, case 532*a* may be sized and configured to hold one or more cassettes 433. For example, drawer unit 432 may be configured to hold an active cassette 533*a* and a spare cassette 533*b*. Although FIG. 5A shows only one spare cassette 533*b*, aspects are not limited to one spare cassette 533*b*, and drawer unit 432 may be configured to hold a plurality of spare cassettes 533*b*.

In some aspects, panel 532*b* may be configured to open to receive one or more cassettes 433, and to close and lock thereafter. In some aspects, panel 532*b* may be manually opened by a user or may be opened in response to a signal from a controller, for example, controller 436. In some aspects, panel 532*b* may be opened automatically, for example, when all of the probe cards in one or more of active cassette 533*a* and/or spare cassette 532*b* are no longer operational.

Within some aspects, cassette opening mechanism 532*c* may be configured to interact with active cassette 533*a* to open active cassette 533*a*. As shown in FIG. 5B, in some aspects, cassette opening mechanism 532*c* may comprise a support 532*d*, an arm 532*e* extending from support 532*d*, and a head 532*f* connected to arm 532*e*. In some aspects, head 532*f* may comprise an opening mechanism configured to open active cassette 533*a*. As a non-limiting example, head 532*f* may comprise one or more electromagnets configured to interact with a metal plate of active cassette 533*a* to open and/or close active cassette 533*a*. In some aspects, cassette opening mechanism 532*c* may comprise an actuator configured to extend and/or retract support 532*d* along a vertical direction with respect to active cassette 533*a*. In some aspects, drawer unit 432 may comprises one or more stationary cams configured to interact with active cassette 533*a*, to automatically open active cassette 533*a* as drawer unit 432 moves from an open position for loading cassettes into a closed position for use. In some aspects, head 532*f* may comprise one or more contact pins configured to sense contact between head 532*f* and a metal plate of one or more of active cassette 533*a* and/or spare cassette 532*b*.

According to some aspects, drawer unit 432 may include a shelf 532*g* configured to support active cassette 533*a* and spare cassette 533*b*. In some aspects, shelf 532*g* may be configured to extend from drawer slide 532*h* along one or more rails. In some aspects, shelf 532*g* may include one or more connectors configured to interact with connectors on cassettes 533*a* and 533*b*, and such connectors may connect to one more additional electronic components 532*i* contained within drawer slide 532*h*. As non-limiting examples, electronic components 532*i* may include one or more wiring terminal blocks, a drawer close sensor, and a drawer locking mechanism, such as an electromagnet. In some aspects, drawer slide 532*i* may include additional ports and/or connectors, such as a vacuum connection, a suction port, and/or additional electrical connections.

Figures 6A, 6B:
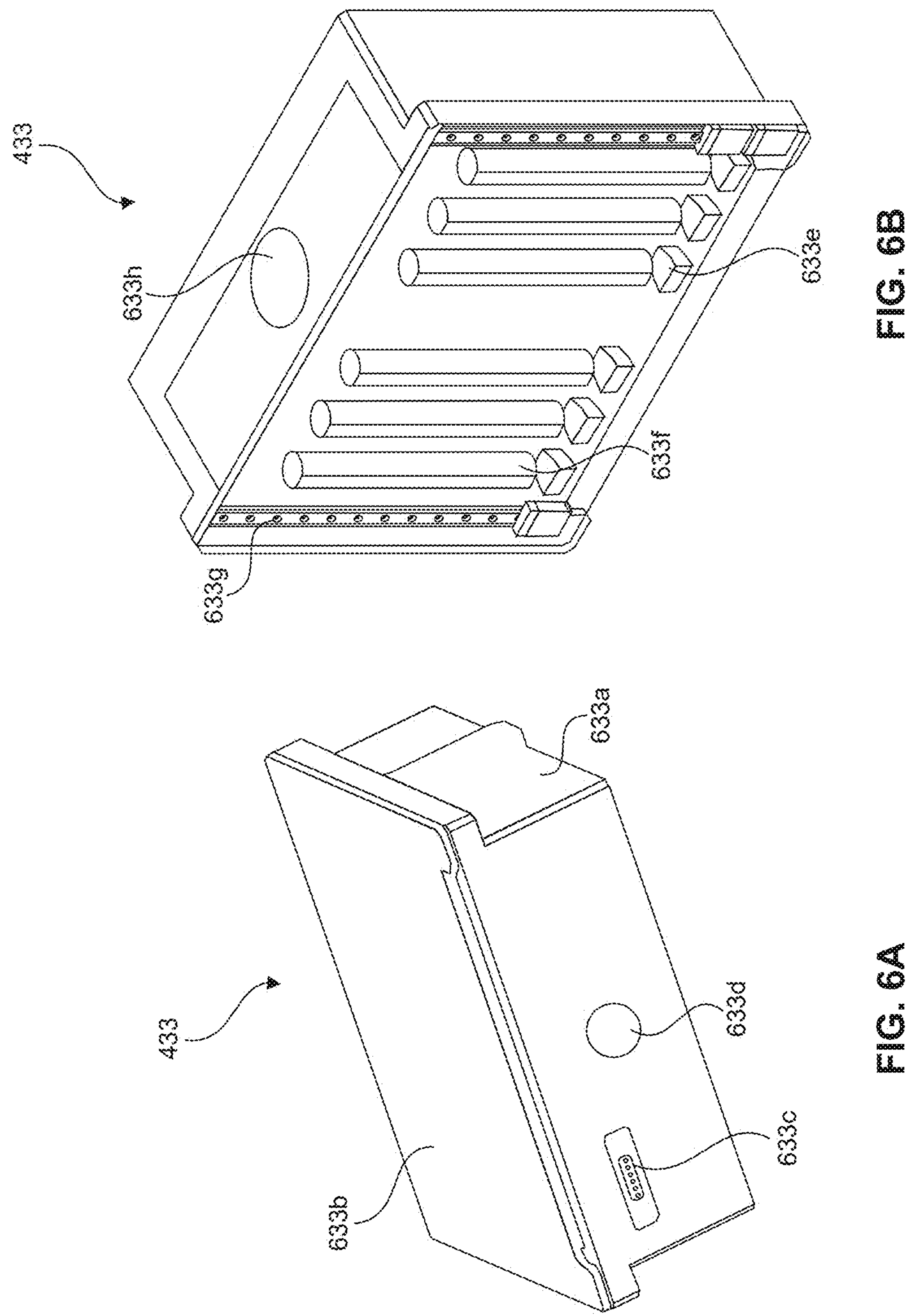
FIGS. 6A and 6B illustrate perspective views of a cassette of a probe card replacement station of a test system, according to some aspects.

FIGS. 6A and 6B show perspective views of cassette 433 according to some aspects. FIG. 6A shows a view of cassette 433 including cover 633*b*. FIG. 6B shows a view of cassette 433 with cover 633*b* omitted to show additional elements of cassette 433. Within some aspects, cassette 433 may include a case 633*a*, a movable cover 633*b*, one or more electrical connectors 633*c*, and one or more mounts 633*d*. In some aspects, cassette 433 may include a plurality of magnets 633*e* and a plurality of probe card securing bars 633*f*. A plurality of probe cards 302 may be arranged into columns and secured by one or more probe card securing bars 633*f*. In some aspects, cassette 433 may include a slide element 633*g* and a metal plate 633*h*.

According to some aspects, cover 633*b* may be movable to be opened or closed to allow access to probe cards 302 contained there. In some aspects, head 532*f* of drawer unit 432 may interact with and thereby unlock cover 633*b*. By continuing to interact with metal plate 633*h*, head 532*f* may cause cover 633*b* to move along slide element 633*g*, thereby opening cassette 433 to expose probe cards 302 stored therein.

In some aspects, electrical connectors 633*c* and mounts 633*d* on cassette 433 may interact with one or more elements of shelf 532*g*. For example, in some aspects, when cassette 433 is positioned onto shelf 532*g*, one or more mounts 633*d* may interact with corresponding mounting elements on shelf 532*g* to secure cassette 433 in place with respect to shelf 532*g*. In addition, one or more electrical connectors 633*c* may interact with corresponding electrical connectors on shelf 532*g* so that cassette 433 is electrically connected to drawer unit 432. In some aspects, an interior surface of cassette 433 may comprise a printed circuit board (PCB) configured to interact with the probe cards stored therein.

Within some aspects, cassette 433 may store a plurality of probe cards 302. As a non-limiting example, cassette 433 may be sized and configured to store 20 or more probe cards 302, 30 or more probe cards 302, or 40 or more probe cards 302. In at least one exemplary aspect, cassette 433 may be sized and configured to store at least 50 or more probe cards 302. Each probe card 302 within cassette 433 may be a new (unused) probe card or a used probe card that has been used by test system 100 to perform at least one measurement. In some aspects, cassette 433 may also include one or more dummy probe cards configured to calibrate one or more electrical and/or mechanical components of the test system. As one example, cassette 433 may include a dummy probe card configured to calibrate SMU 162*a*, 162*b*. As another example, cassette may include a dummy probe card configured to determine and/or compensate for the positions of the probe cards and/or to align and calibrate the position of probe card manipulator 120.

Returning to FIG. 4, in some aspects, drawer unit 432 may be configured to scan cassette 433 to identify one or more probe cards 302 in cassette 433. For example, drawer unit 432 may be configured to identify one or more new probe cards in cassette 433, to identify one or more used probe cards in cassette 433, and/or to identify one or more dummy probe cards in cassette 433. Within some aspects, drawer unit 432 may identify one or more probe cards 302 based on a serial number or other identifier of the probe card 302, or by measuring or sensing one or more properties of the probe card 302, such as a resistance of one or more of the flexible probes in probe array 314 of the probe card 302 or a magnetic field emitted by the probe card 302.

According to some aspects, controller 436 may be configured to control one or more functions of probe card replacement station 140. For example, controller 436 may be configured to receive an indication that a user wants to open drawer unit 432. In response to this indication, controller 436 may control drawer unit 432 to close a cover of cassette 433 (e.g., active cassette 533*a*) and to unlock drawer unit 432 so that the user can open drawer unit 432. As another example, controller 436 may receive an indication that a user has loaded a new cassette 433 into drawer unit 432 and closed drawer unit 432. In response to such an indication, controller 436 may control drawer unit 432 to lock drawer unit 432 and to scan cassette 433 to identify one or more probe cards therein. Such indications may be provided, for example, in response to a user pushing one or more buttons on panel 532*b* (shown in FIGS. 5A and 5B) or interacting with controller 436.

Figure 7:
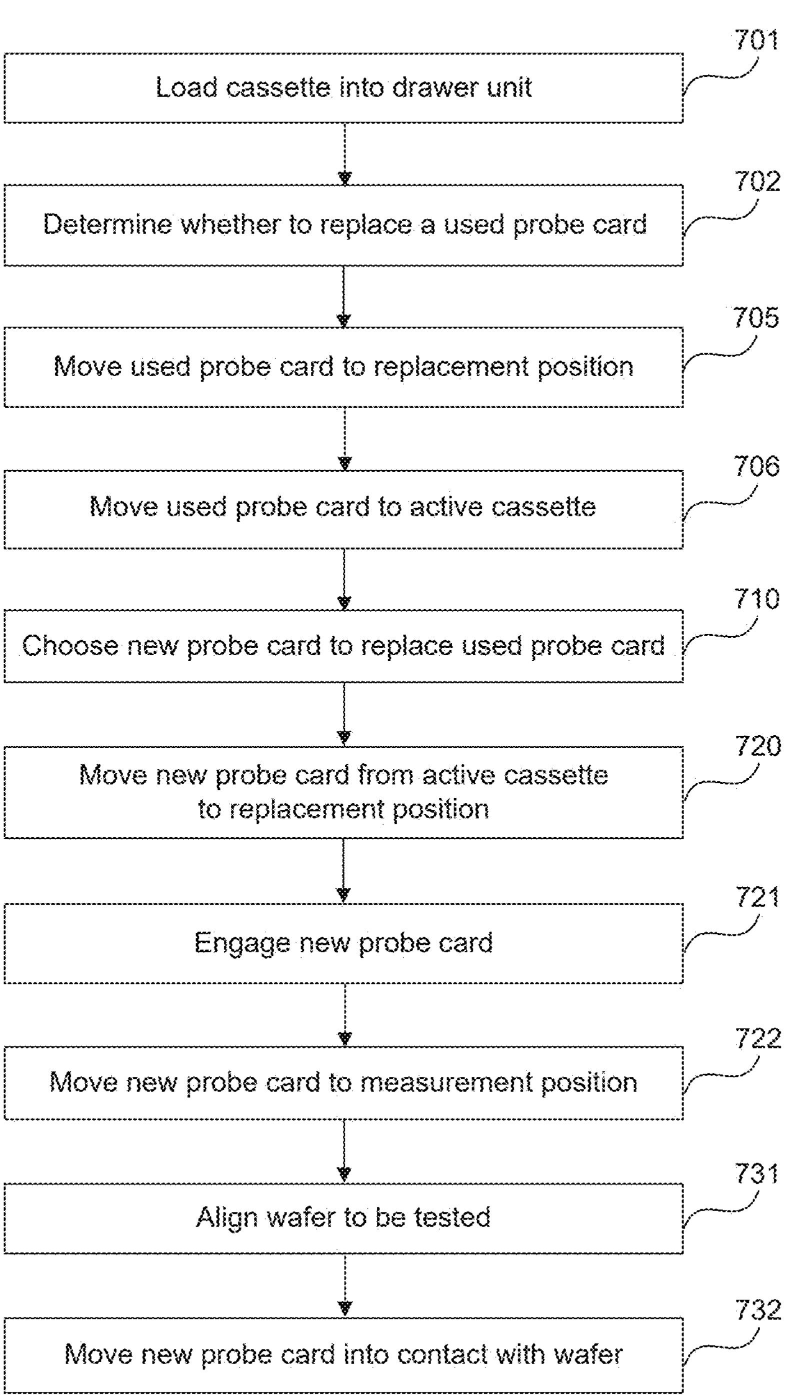
FIG. 7 illustrates a flowchart of a process for replacing a probe card in a test system, according to some aspects.

FIG. 7 shows a flowchart for a process 700 of replacing a probe card in a test system 100, according to some aspects. Within some aspects, the steps and operations of process 700 may be performed by one or more components of test system 100. In some aspects, probe card manipulator 120 and probe card replacement station 140 may perform one or more steps or operations of process 700 under control of controller 436.

Process 700 may begin, according to some aspects, with an optional operation 701 of loading cassette 433 into drawer unit 432 of probe card replacement station 140. For example, in some aspects, operation 701 may comprise a user manually loading a cassette, such as active cassette 533*a* or spare cassette 533*b* into drawer unit 432 of probe card replacement station 140. In some aspects, a user may initiate this sequence by indicating to controller 436 the user's desire to open drawer unit 432. In some aspects, the user may press a button on panel 532*b* of drawer unit 432 to request access to drawer unit 432. In some aspects, the user may input a command to controller 436 to request access to drawer unit 432. In some aspects, loading of active cassette 533*a* or spare cassette 533*b* into drawer unit 432 may be automated, for example, when the number of unused (new) probe cards in active cassette 533*a* or spare cassette 533*b* falls below a threshold number or when active cassette 533*a* is changed to spare cassette 533*b*. In some aspects, active cassette 533*a* may be changed to spare cassette 533*b* when active cassette 533*a* no longer stores at least a threshold number of unused (new) probe cards, or when a change in DUT 116 requires a different probe card 302 that is stored in active cassette 533*a*.

In response to an indication from the user or to an automated reloading indication, controller 436 may unlock drawer unit 432, according to some aspects, to grant access to the one or more cassettes 433 stored therein. In some aspects, prior to unlocking drawer unit 432, controller 436 may determine if cover 633*b* of active cassette 533*a* is closed. In some aspects, prior to unlocking drawer unit 432, controller 436 may determine if it is safe to open drawer unit 432. If controller 436 detects any condition indicating it should not unlock drawer unit 432, controller 436 may deny the request to access drawer unit 432 and send an error indicator to a user, for example, via user computer 104. If controller 436 does not detect any condition indicating it should not unlock drawer unit 432, controller 436 may unlock drawer unit 432 to grant access to drawer unit 432.

According to some aspects, once drawer unit 432 is unlocked, drawer unit 432 may be accessed to remove used cassettes and/or to add new cassettes. In some aspects, a new cassette may be loaded into drawer unit 432 by placing the new cassette in drawer unit 432 so that one or more mounts 633*d* and/or electrical connectors 633*c* of the new cassette interact with corresponding mounts and/or electrical connectors on shelf 532*g* of drawer unit 432. For example, in some aspects, one or more mounts 633*d* and/or electrical connectors 633*c* of cassette 433 may be positioned to interact with corresponding mounts and/or electrical connectors on drawer shelf 532*g* of drawer unit 432. In some aspects, the new cassette may be positioned by a user accessing drawer unit 432. In some aspects, the new cassette may be positioned by an automated reloading system, such as a robotic arm programmed to move the new cassette into a loading position.

According to some aspects, after the new cassette has been loaded on shelf 532*g* of drawer unit 432, drawer unit 432 may be closed, causing controller 436 to control drawer unit 432 to lock and begin scanning the new cassette. In some aspects, controller 436 may control drawer unit 432 to scan one or more new cassettes 433 (e.g., active cassette 533*a* and/or spare cassette 533*b*) to identify one or more probe cards 302 stored therein. Identities of the probe cards 302 may be determined at least as a new probe card, a used probe card, or a dummy probe card, optionally in addition to one or more characteristics of probe card 302, and these identities may be stored in memory 437 along with other attributes of probe card 302, which may be retrieved from the cassette or probe card by a designated device. Drawer unit 432 may also in some aspects interact with active cassette 533*a* so as to cause cover 633*b* of active cassette 533*a* to open, thereby exposing probe cards 302 stored therein.

Within some aspects, process 700 may proceed to operation 702 (or may begin at operation 702) by determining whether to replace a used probe card. According to some aspects, controller 436 may determine that a used probe card should be replaced because the used probe card has begun to malfunction, or because the used probe card has exceeded a threshold number of measurements. In some aspects, controller 436 may determine that a used probe card should be replaced because a different type of DUT 116 is to be tested by test system 100 and the used probe card is not satisfactory for testing the different type of DUT 116. Controller 436 may also determine, in some aspects, that the used probe card should be replaced by a dummy probe card from active cassette 533*a* in order to calibrate one or more electrical components of test system 100. In some aspects, a user may indicate to controller 436 that a used probe card should be replaced. Aspects are not limited to these examples, and controller 436 may determine to replace the used probe card for various other reasons. In some aspects, controller 436 may determine if there is a probe card attached to probe card manipulator 120, and, if not, to retrieve a new, used, or dummy probe card from active cassette 533*a*. In some aspects, controller 436 may communicate with a probe card attached to probe card manipulator 120 to read and/or write information to the probe card.

In response to determining that the used probe card should be replaced, process 700 may proceed to operation 705 by moving the used probe card to replacement position 140. In some aspects, operation 705 may be implemented by controlling probe card manipulator 120 to manipulate the used probe card from a measurement position to a replacement position. In some aspects, if active cassette 533*a* is not maintained in the open position during measurement of the DUT 116, controller 436 may also control drawer unit 432 to open cassette 433. As one example, controller 436 may control head 532*f* of drawer unit 432 to interact with metal plate 633*h* of cassette 433 to cause cover 633*b* to move, thereby opening cassette 433.

Within some aspects, at operation 706, once the used probe card has been moved to the replacement position and active cassette 533*a* is open, probe card exchanger 134 may move the used probe card to active cassette 533*a*. In some aspects, operation 706 may be performed by probe card exchanger 134 under the control of controller 436. As a non-limiting example, probe card exchanger 134 may comprise a robotic arm configured to move a retrieval tool to the used probe card held by probe card manipulator 120, to engage the retrieval tool with the used probe card, and, after the used probe card is released by probe card manipulator 120, to move the used probe card to active cassette 533*a*. In some aspects, probe card exchanger 134 may move the used probe card to the same slot in active cassette 533*a* from which the used probe card was retrieved before use. In some aspects, probe card exchanger 134 may move the used probe card to any available empty slot in active cassette 533*a*. According to some aspects, after moving the used probe card to the empty slot in active cassette 533*a*, probe card exchanger 134 may cause the retrieval tool to disengage with the used probe card, thereby storing the used probe card in active cassette 533*a*.

According to some aspects, process 700 may then proceed to operation 710 by choosing a new probe card to replace the used probe card. In some aspects, operation 710 may be implemented by controller 436 choosing a new probe card for use.

In some aspects, controller 436 may select a new probe card according to a predetermined order. For example, controller 436 may follow a sequential usage order, and thus may choose the next probe card 302 in the sequential usage order for use by test system 100.

In some aspects, controller 436 may select a new probe card according to one or more parameters of the wafer having DUT 116 to be tested by test system 100. As a non-limiting example, active cassette 533*a* may include various different types of probe cards 302 corresponding respectively to different devices to be tested by test system 100. By knowing the type of wafer or device to be tested or DUT 116, controller 436 may select a probe card 302 that is designed for testing the wafer, device, or DUT 116 from active cassette 533*a*. Thus, in some aspects, controller 436 may select a probe card 302 from active cassette 533*a* based on the wafer, device, or DUT 116. In some aspects, controller 436 may initiate process 700 in response to a new wafer, device, or DUT 116 being loaded into test system 100. In some aspects, controller 436 may receive an indication that one or more electrical components of test system 100 should be tested and/or calibrated. In response to such an indication, controller 436 may select a dummy probe card from active cassette 533*a*. Thus, controller 436 may determine the type of probe card 302 to be selected and, based on that determination, may select a probe card 302 of the determined type from active cassette 533*a*.

Although FIG. 7 shows that operation 710 may take place after the used probe card has been stored in active cassette 533*a*, aspects are not limited to this configuration. In some aspects, operation 710 may take place at any time once process 700 has been initiated. For example, in some aspects, operation 710 may take place at the same time that the used probe card is being retrieved from probe card manipulator 120 in operations 705 and 706. In some aspects, operation 710 may be the very first operation performed in process 700.

Once a new probe card has been selected for use, operation 700 may proceed, according to some aspects, to operation 720 by moving the new probe card from active cassette 533*a* to the replacement position. In some aspects, operation 720 may be implemented by probe card exchanger 134 transferring the new probe card to the replacement position. As a non-limiting example, probe card exchanger 134 may comprise a robotic arm configured to move a retrieval tool to the new probe card in active cassette 533*a*, to engage the retrieval tool with the new probe card, to withdraw the new probe card from a storage slot in active cassette 533*a*, and to move the new probe card from active cassette 533*a* to the replacement position of probe card manipulator 120. However, aspects are not limited to this example, and probe card exchanger 134 may comprise other means for transferring the new probe card from active cassette 533*a* to probe card manipulator 120.

At operation 721, the new probe card may be engaged by probe card manipulator 120, according to some aspects. As a non-limiting example, probe card manipulator 120 may engage the new probe card in the replacement position. Thereafter, or simultaneously therewith, probe card exchanger 134 may release the new probe card from the retrieval tool, so that the new probe card may be manipulated by probe card manipulator 120. At operation 722, the new probe card may be moved to the measurement position of probe card manipulator 120. In some aspects, operation 722 may further comprise controller 436 controlling probe card manipulator 120 and/or probe card exchanger 134 to perform a full hand shake procedure, to ensure proper engagement of the probe card with probe card manipulator 120.

At operation 731, the wafer having DUT 116 to be tested may be aligned, according to some aspects. Within some aspects, operation 731 may include steps of aligning the wafer with a predetermined alignment direction and moving the wafer into close proximity with the new probe card at the measurement position. According to some aspects, the wafer may be rotated so that devices of DUT 116 disposed on the surface of the wafer align with a predetermined alignment direction. In some aspects, such an alignment step may ensure that the devices on the wafer and the flexible probes in probe array 314 on probe card 302 are in alignment so that probe card 302 can accurately perform a scanning measurement on the devices on the wafer. In some aspects, operation 731 may be performed by rotating the wafer and moving the wafer into close proximity with the new probe card using stage 179. As one example, operation 731 may be performed by DUT holder 114. Thus, in some aspects, the wafer may be aligned and moved into a measurement position with respect to the new probe card. However, aspects are not limited to this configuration, and operation 731 may be performed by moving probe card 302 to the wafer.

At operation 732, the new probe card may be moved into contact with the wafer. In some aspects, operation 732 may include moving probe card 302 by probe card manipulator 120 so that probe array 314 on the new probe card is placed in contact with the devices on the wafer. As one example, after the wafer is moved by DUT holder 114 in operation 731, probe card manipulator 120 may gradually lower the new probe card along a z-axis (height) direction until the probes of the new probe card contact the devices on the wafer. Further aspects of operation 732 are discussed below with regard to FIG. 10. Once operation 732 is completed, process 700 may be concluded, and test system 100 may begin measuring and testing the devices on the wafer.

According to some aspects, operation 700 may be implemented using stored or predetermined positions for probe card manipulator 120 and stage 179. In some aspects, the use of stored or predetermined positions may be advantageous where similar devices are being tested by similar probe cards 302 with tight manufacturing tolerances. Within some aspects, the use of such stored or predetermined positions may allow for faster replacement of a used probe card and thus higher throughput when testing substantially similar devices in large numbers.

However, in some aspects, the use of stored or predetermined positions may not be practical, for example, when changing between types of devices or wafers to be tested. In some aspects, to ensure proper contact between DUT 116 on the wafer and the new probe card, it may be desirable to align and test the new probe card against registration plate 475 prior to commencing measurement and testing of DUT 116.

Figure 8:
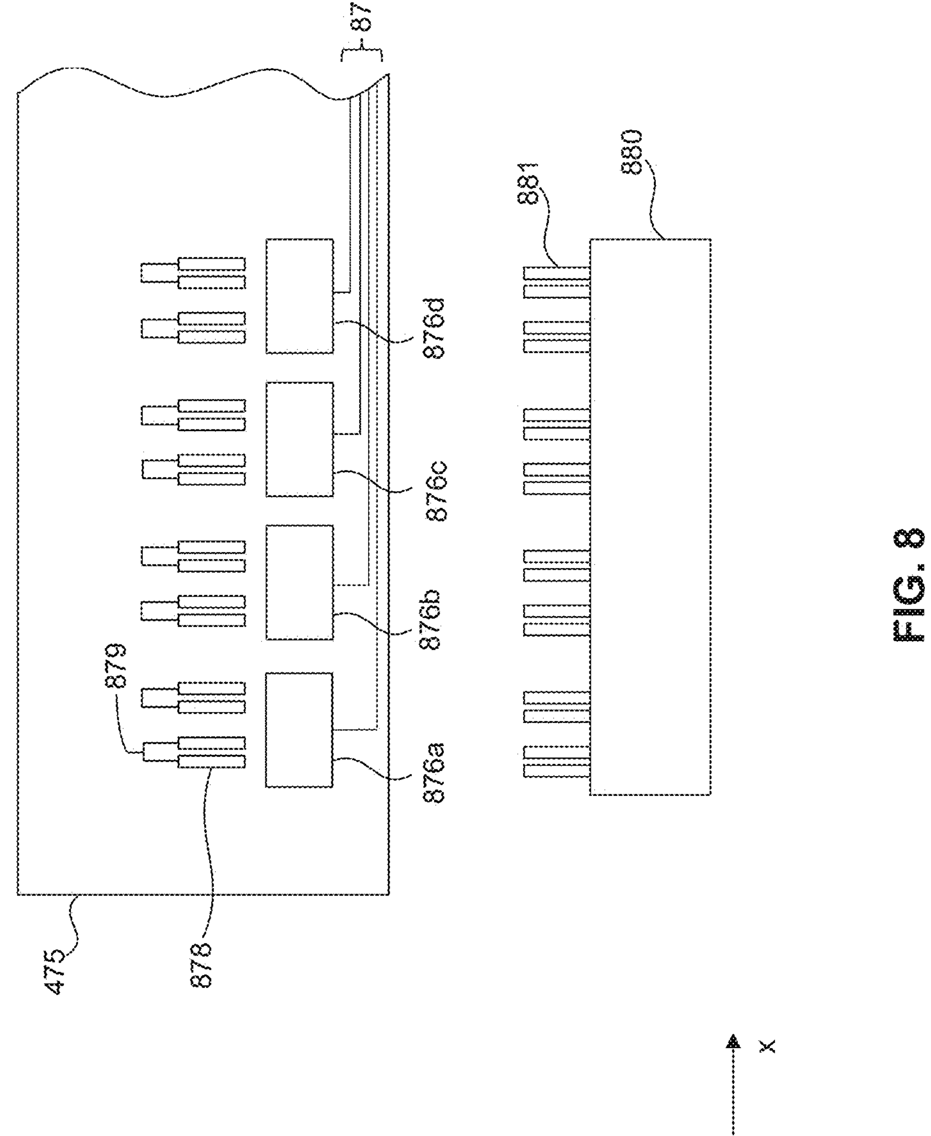
FIG. 8 illustrates schematics of a registration plate used in the alignment and testing of a probe card, according to some aspects.
Figure 9:
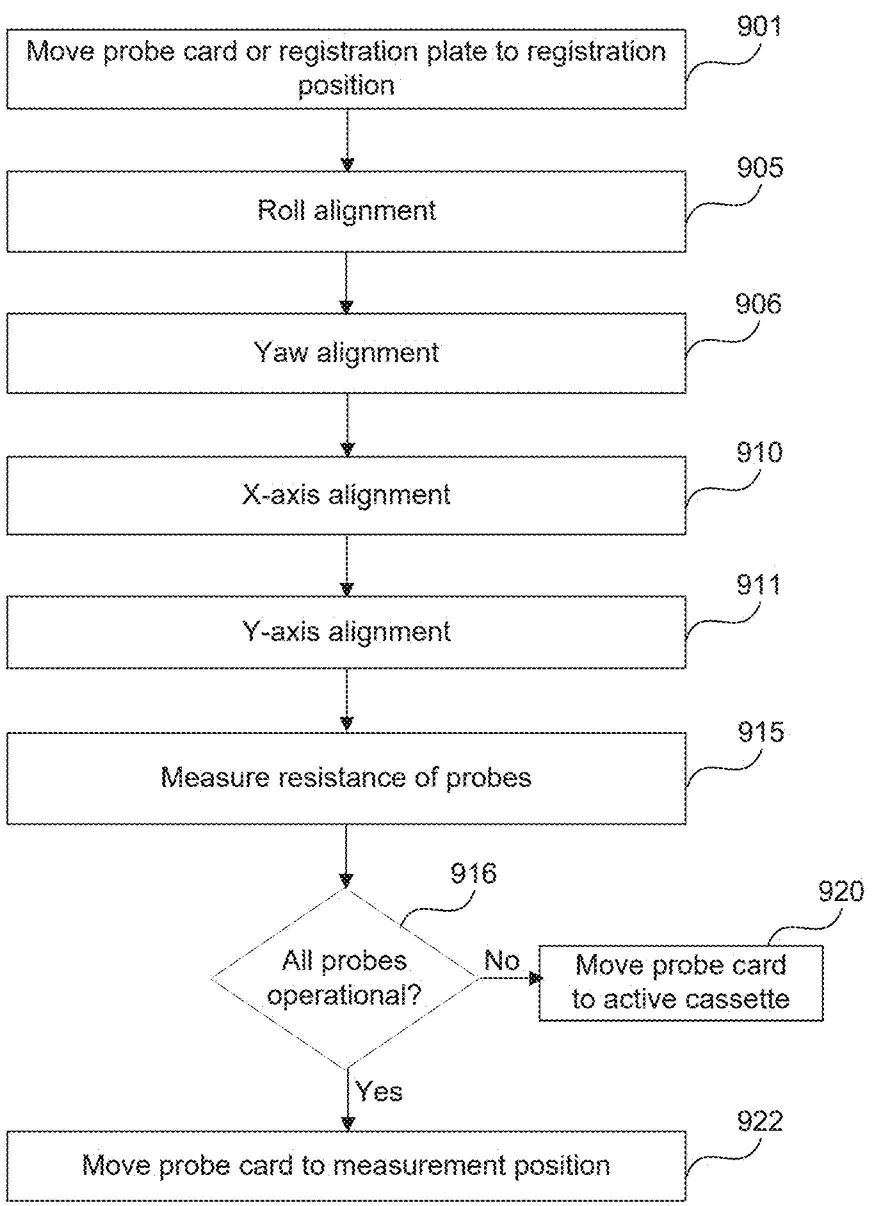
FIG. 9 illustrates a flowchart for a process of aligning and testing a probe card using a registration plate, according to some aspects.

FIG. 8 shows a configuration of registration plate 475 according to some aspects. To provide additional explanation, a probe head 880 of probe card 302 in some aspects, including a plurality of flexible probes 881 (similar to flexible probe array 314) arranged in an array, is also shown in FIG. 8. FIG. 9 shows a flowchart of a process 900 for aligning and testing probe card 302 using registration plate 475, according to some aspects.

Beginning with FIG. 8, registration plate 475 according to some aspects may include a plurality of roll alignment pads 876*a*-876*d* and a plurality of probe integrity test pads 878. Within some aspects, the plurality of roll alignment pads 876*a*-876*d* may be arranged into a single row along one direction (e.g., the x-direction in FIG. 8). In some aspects, each roll alignment pad 876*a*-876*d* may be connected to a respective trace 877 that connects the roll alignment pad 876*a*-876*d* to a respective contact pad (not shown). In some aspects, each roll alignment pad 876*a*-876*d* may comprise a large, electrically conductive pad.

According to some aspects, each probe integrity test pad 878 may comprise a smaller, electrically conductive pad elongated along a second direction (e.g., the y-direction in FIG. 8). In some aspects, probe integrity test pads 878 may each be electrically connected to a respective connection 879. In some aspects, connections 879 may comprise a metallic fan-out configuration, so that each probe integrity test pad 878 is connected to a respective contact pad (not shown). In some aspects, connections 879 may connect two probe integrity test pads 878 together. In some aspects, connections 879 may comprise metal traces. In some aspects, connections 879 may comprise additional components. As a non-limiting example, connections 879 may connect two respective probe integrity test pads 878 via a metal trace and an integrated resistor formed on the surface or beneath the surface of registration plate 475. Aspects are not limited thereto, and other components may be formed on or in registration plate 475 to provide various connections between respective probe integrity test pads 878. In some aspects, the test system may comprise a plurality of registration plates configured to test and/or calibrate different probe cards configured to measure different DUTs. In some aspects, the test system may automatically determine a registration plate to be used to test and/or calibrate a particular probe card. As a non-limiting example, the test system may use information such as the ID and the type of the probe card to determine a registration plate that should be used to test and/or calibrate the probe card.

As noted above, FIG. 9 shows a flowchart of a process 900 for aligning and testing a probe card using a registration plate, according to some aspects. Within some aspects, process 900 for aligning and testing a probe card 302 using a registration plate 475 may begin at operation 901 by moving probe card 302 or registration plate 475 to a registration position. In some aspects, the registration position may be a position that is different from each of the measurement position and the replacement position of probe card manipulator 120. For example, in some aspects, operation 901 may be implemented by probe card manipulator 120 manipulating probe card 302 from the replacement position to a registration position that is between the replacement position and the measurement position. In some aspects, the registration position may be the same as the measurement position. For example, in some aspects, operation 901 may be implemented by probe card manipulator 120 manipulating probe card 302 from the replacement position to the measurement position, and registration plate 475 then being brought into proximity with probe card 302 at the measurement position. According to some aspects, by aligning and testing probe card 302 with registration plate 475 at the measurement position, it may be possible to align probe card 302 for measurement during process 900 without requiring an additional alignment process that may be required when probe card 302 is moved from a registration position to the measurement position.

According to some aspects, after registration plate 475 and probe card 302 are brought into proximity with one another in operation 901, process 900 may proceed to operation 905 by performing roll alignment. Referring to FIG. 8, the roll alignment of probe head 880 may refer to an angle formed between an x-axis of probe head 880 and an x-axis of registration plate 475 (both along the x-direction in the coordinate axis at the bottom of FIG. 8). In some aspects, the roll alignment of probe head 880 with respect to registration plate 475 may be determined using the roll alignment pads 876*a*-876*d*. As probe head 880 is brought into contact with roll alignment pads 876*a*-876*d*, if there is any misalignment in the roll alignment between probe head 880 and registration plate 475, the probes 881 on probe head 880 may contact only either the first roll alignment pad 876*a* or the last roll alignment pad 876*d*, resulting an electrical connection between the probe head and less than all of the roll alignment pads 876*a*-876*d*. As an example, in some aspects, roll misalignment between probe head 880 and registration plate 475 may result only in an electrical connection between first roll alignment pad 876*a* and respective ones of probes 881. In this example, probe card manipulator 120 may adjust the roll alignment of probe head 880 until an electrical connection is formed between probes 881 and last roll alignment pad 876*d*. Once probes 881 are able to form an electrical connection with each of roll alignment pads 876*a*-876*d*, the system may determine that the roll alignment of the probe card is correct with respect to registration plate 475.

Within some aspects, after completing roll alignment in operation 905, process 900 may continue to operation 906 of performing yaw alignment. In some aspects, operation 906 may include using roll alignment pads 876*a*-876*d* to perform yaw alignment of probe head 880 with respect to registration plate 475. Referring again to FIG. 8, yaw alignment may refer to an angle of rotation in the x-y plane formed between the y-axis of probe head 880 and the y-axis of registration plate 475. According to some aspects, a yaw angle misalignment may be detected by moving probe head 880 in the x-y plane with respect to registration plate 475. If all of probes 881 lose electrical contact (or make electrical contact) with a respective roll alignment pads 876*a*-876*d* at about the same time, it can be determined that probe head 880 is aligned in yaw alignment with registration plate 475. In some aspects, it may be determined that all of probes 881 make or lose electrical contact at about the same time if they all make or lose contact within a predetermined period, for example, in less than one second, in less than 500 milliseconds, in less than 100 milliseconds, or in less than 50 milliseconds. On the other hand, if one or more probes 881 loses electrical contact (or makes electrical contact) with a respective roll alignment pad 876*a*-876*d* either before or after others of probes 881 with a respective roll alignment pad 876*a*-876*d*, it can be determined that probe head 880 is misaligned in yaw alignment with registration plate 475. In this case, probe card manipulator 120 may adjust the yaw alignment of probe head 880 by rotating probe head 880 in the x-y plane, and then performing another yaw alignment measurement. Probe card manipulator 120 may repeat this process until it is determined that probe head 880 is aligned in yaw alignment with registration plate 475.

According to some aspects, after completing yaw alignment in operation 906, process 900 may continue to operation 910 of performing x-axis alignment. In some aspects, operation 910 may include using integrity test pads 878 to perform x-axis alignment of probe head 880 with respect to registration plate 475. Referring to FIG. 8, x-axis alignment may refer to a translation of probe head 880 along the x-axis direction with respect to registration plate 475. According to some aspects, x-axis alignment may be performed by measuring a resistance of each probe 881 to determine that each probe 881 is in electrical contact with a respective integrity test pad 878. In some aspects, if one or more probes 881 is not in electrical contact with a respective integrity test pad 878, probe card manipulator 120 may adjust an x-axis alignment of probe head 880 by moving probe head 880 along the x-axis, and then performing another x-axis alignment measurement. Probe card manipulator 120 may repeat this process until it is determined that probe head 880 is aligned in x-axis alignment with registration plate 475 because each probe 881 is in electrical contact with a respective integrity test pad 878.

After completing x-axis alignment in operation 910, process 900 may continue according to some aspects to operation 911 of performing y-axis alignment. In some aspects, operation 911 may include of using integrity test pads 878 to perform y-axis alignment of probe head 880 with respect to registration plate 475. Referring to FIG. 8, y-axis alignment may refer to a translation of probe head 880 along the y-axis direction with respect to registration plate 475. In some aspects, y-axis alignment may be performed by measuring a resistance of each probe 881. In some aspects, if probe head 880 is not in y-axis alignment with registration plate 475, one or more probes 881 may exhibit a higher resistance value. In some aspects, y-alignment may be determined optically. For example, probes 881 may be visually inspected to determine if probe head 880 is in y-axis alignment with registration plate 475. As another non-limiting example, one or more optical measurements may be performed to determine if probe head 880 is in y-axis alignment with registration plate 475. If it is determined that probe head 880 is not in y-axis alignment with registration plate 475, probe card manipulator 120 may move probe head 880 up or down along the y-axis until the resistance value for each probe 881 is a minimum value, indicating that each probe 881 is in y-axis alignment with the respective integrity test pad 878. Probe card manipulator 120 may repeat this process until it is determined that probe head 880 is aligned in y-axis alignment with registration plate 475.

According to some aspects, after completing roll, yaw, x-axis, and y-axis alignment in operations 905, 906, 910, and 911, respectively, process 900 may proceed to operation 915 of measuring the resistance of the probes 881. In some aspects, operation 915 may include testing probe head 880 to ensure that each probe 881 is operational. In some aspects, operation 915 may comprise applying an electric voltage or an electric current to each probe 881 and measuring one or more properties of each probe 881. As a non-limiting example, operation 915 may comprise applying an electric voltage to each probe 881 and measuring an electrical resistance of the probe 881. Each probe 881 may be determined to be operational if the measured electrical resistance value is within a predetermined operational range. In contrast, if the measured electrical resistance value is higher than or lower than the predetermined operational range, such a value may indicate that the probe 881 is malfunctioning or is otherwise not operating as expected. The above example is merely illustrative, and other electrical, magnetic, electromagnetic, optoelectrical, or electromechanical measurements may be used instead of, or in addition to, electrical resistivity measurements.

Within some aspects, at operation 916, control computer 126 may determine if all probes 881 of probe head 880 are operational based on the measurements performed in operation 915. If all of the probes 881 are determined to be operational (operation 916: YES), process 900 may proceed to operation 922, wherein, in some aspects, probe card 302 may be moved by probe card manipulator 120 to the measurement position or, in some aspects, registration plate 475 may be removed and the wafer to be tested may be brought to probe card 302, which is already in the measurement position. In this case, operation 922 may be the same as operation 722 in process 700, and probe card 302 may be aligned with the wafer by being moved into contact with the wafer as in steps 731 and 732 of process 700. However, if one or more probes 881 are determined to be not operational (operation 916: NO), process 900 may proceed to operation 920. In this case, the malfunctioning or defective probe card may be moved to active cassette 533*a*, and a new probe card may be selected from active cassette 533*a* to replace the malfunctioning or defective probe card. In some aspects, operation 916 may include a step of calibrating the probe card using registration plate 475. As a non-limiting example, the resistances of one or more probes of the probe measured using registration plate 475 may be used to calibrate one or more electrical components of the test system such as, for example, the SMU.

Although FIG. 9 describes process 900 for aligning and testing probe card 302 with registration plate 475 with regard to a new probe card selected from active cassette 533*a*, aspects are not limited to this configuration. Process 900 may be used in different contexts and may be performed by excluding one or more steps or operations. As one example, while measuring and testing the devices on a wafer, it may be desirable to test probe card 302 being used to determine if probe card 302 is within operating specifications. In this case, the wafer may be moved away from probe card 302 and registration plate 475 may be brought into close proximity with probe card 302. If probe card 302 was previously aligned with registration plate 475 (e.g., when probe card 302 was first retrieved from active cassette 533*a* or during a previous testing of probe card 302 with registration plate 475), one or more alignment steps in process 900 may be omitted.

Figure 10:
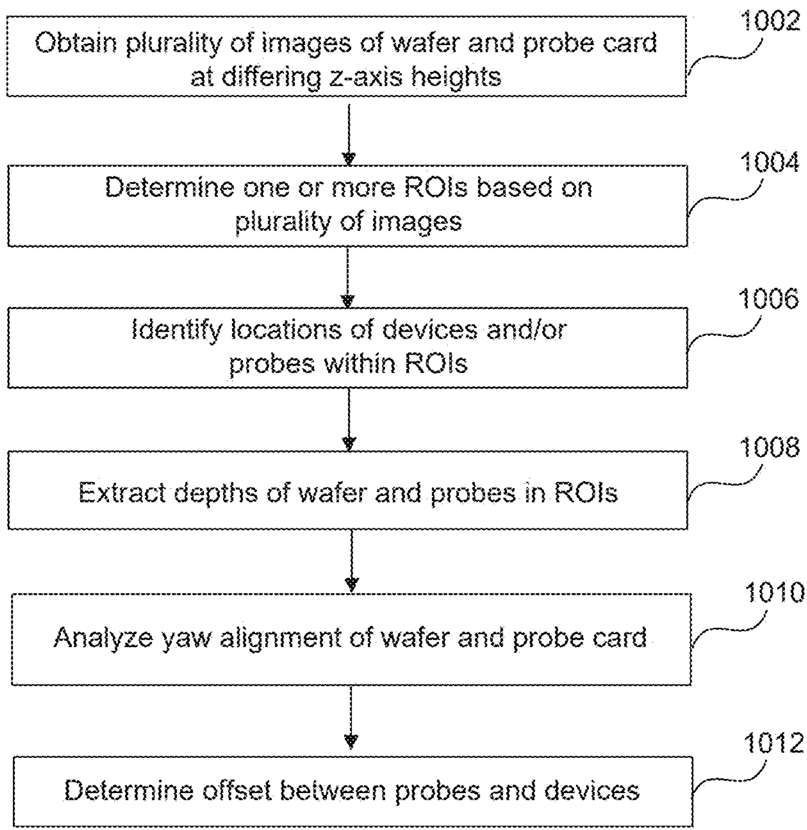
FIG. 10 illustrates a flowchart for a process of aligning a probe card with a wafer for measurement in a test system, according to some aspects.

FIG. 10 shows a flowchart for a process 1000 of aligning probe card 302 to and contacting probe card 302 with a wafer having DUT 116 to perform a measurement of devices on the wafer, according to some aspects. In some aspects, process 1000 may be performed as part of operation 732 in process 700.

According to some aspects, process 1000 may begin at operation 1002 by obtaining a plurality of images of the wafer and probe card 302 at different z-axis heights. In some aspects, probe card 302 may have already been aligned during registration process 900, and process 1000 may be used to ensure proper contact between probe card 302 and the wafer. In some aspects, probe card 302 may have been moved to the measurement position without being previously aligned. For example, process 1000 may be performed, in some aspects, without first performing alignment and registration process 900. In some aspects, the wafer may be provided on a different plane from the registration plate.

Within some aspects, operation 1002 may be performed by one or more imaging devices. As a non-limiting example, in some aspects, operation 1002 may be performed by a CCD camera or a CMOS camera. According to some aspects, in operation 1002, an imaging device may be configured to take a plurality of images of probe card 302 and the wafer to be tested. Within some aspects, as each image is taken, a focal height of the imaging device along the z-axis may be changed. In some aspects, operation 1002 may begin by setting the imaging device to have a focal height that is above the height of probe card 302 and the wafer. During operation 1002, the focal height of the imaging device may be step-wise lowered with each new image. According to some aspects, the plurality of images may gradually focus on the height of probe card 302 and the wafer before eventually losing focus on probe card 302 and wafer again as the focal height of the imaging device decreases below the height of probe card 302 and wafer. As one example, a new image may be captured at increments of, for example, 5 micron focal height. In this way, the plurality of images may constitute a stack of images along the z-axis, with one or more of the images near the middle of the stack showing the probe card and/or the wafer in high focus sharpness. In some aspects, illumination may be provided at an angle that allows more light reflected from the probes to enter the objective of the imaging device, which provide higher contrast for edge detection or template matching. In at least one exemplary aspect, two differently oriented sources of light may be provided, thereby allowing collection of specular reflections from surfaces of different orientations, such as the devices on the wafer and the probes being held at the operating angle.

Once the imaging device has obtained the plurality of images of the wafer and probe card 302, process 1000 may proceed to operation 1004 by determining one or more regions of interest (ROIs) based on the plurality of images. In some aspects, the entirety of an image may comprise a single ROI, or one ROI may be defined for an entire image. In some aspects, the approximate location of one or more probes 881 and the approximate orientation of the wafer may be known due to, for example, movement tolerances within probe card manipulator 120 or as a result of alignment and registration process 900. Based on this information, one or more ROIs may be identified in the plurality of images. As the plurality of images are analyzed, one or more additional ROIs may be determined based on the presence of devices on the wafer or on the presence of probes 881 on probe card 302. As a non-limiting example, ROIs may be determined for the left and right sides and for the center of probe card 302.

Once one or more ROIs are determined in operation 1004, process 1000 may proceed to operation 1006 by identifying locations of one or more devices and/or probes 881 in one or more of the ROIs. In some aspects, edge analysis may be implemented to analyze the plurality of images to distinguish individual devices and/or probes 881. In operation 1006, the locations of devices or probes 881 in the ROIs may be identified by matching each portion of an image to one or more template images. For example, the template images may include one or more template images showing the devices on the wafer being tested and one or more templates images showing probes 881 on probe card 302. In operation 1006, process 1000 may match portions of each image to one or more of the template images.

According to some aspects, once the identifiable devices and probes 881 within the ROIs have been matched to the template images across each of the captured images, process 1000 may proceed to operation 1008 by extracting depths for each of the wafer and probe card 302 in the ROIs. Within some aspects, the number of device matches and the number of probe matches at each z-axis height step may be scored. In some aspects, the height of the wafer may correspond to the depth of the captured image having the highest score of device matches. Likewise, in some aspects, the height of probe card 302 may correspond to the depth of the captured image having the highest score of probe matches. In some aspects, scoring may be implemented across all of the ROIs, so that the height of the wafer and/or probe card 302 is determined based on all of the available matches. In some aspects, scoring may be implemented for each ROI, so that the height of the wafer and/or probe card 302 is determined for each individual ROI. Such individual ROI depth determinations may allow determination as to whether the height of the wafer and/or probe card 302 changes between the ROIs, which may indicate a roll angle in the alignment of the wafer and/or probe card 302.

In addition to determining a roll alignment between the wafer and probe card 302 in operation 1008, at operation 1010, a yaw alignment between the wafer and probe card 302 may be analyzed. According to some aspects, after determining the respective depths of the wafer and probe card 302 in operation 1008, one or more operations may be applied to the captured images. In some aspects, using the captured image corresponding to the height of the probes, the average end of each probe in the ROI may be estimated, the yaw alignment of the probes 881 may be calculated based on the estimated average end, a rotation may be applied to the ROIs, and the average end of each probe 881 in the ROI may be estimated. Because rotating the ROIs will cause some probes 881 to appear longer while shortening others, this process may be repeated until the estimated average end of each probe 881 in each ROI approximately matches, at which point the calculated yaw alignment of probe head 880 based on the last rotation may be determined to be the yaw alignment of probe head 880.

Once the roll and yaw alignment of probe card 302 and the wafer have been determined, probe card manipulator 120 may bring probe card 302 into roll and yaw alignment with the wafer. In some aspects, this process may be repeated iteratively, with probe card 302 being brought into closer roll and yaw alignment with the wafer with each iteration. Thus, in some aspects, one or more of operations 1002-1010 may be repeated until probe card 302 is in satisfactory roll and yaw alignment with the wafer.

According to some aspects, process 1000 may then proceed to operation 1012 of determining an offset between the probes 881 on the probe card 302 and the devices on the wafer to be tested. Within some aspects, when probe card 302 and wafer require only minor or no roll and yaw alignment, operation 1012 may follow immediately after operation 1008 using the same captured images. In some aspects, when probe card 302 and the wafer require substantial roll and yaw alignment, operation 1012 may initially commence by capturing a new set of images as in operation 1002. In either case, at operation 1012, the probes 881 only within the ROIs may no longer be tracked, but may instead each of the probes 881 on probe card 302 may be matched (attempted to match) to a template image.

According to some aspects, once the location of each probe 881 is determined, an offset between the probes 881 and the devices in the x- and y-directions can be calculated. Probe card manipulator 120 may then be controlled to minimize the offset in each of the x- and y-directions, to thereby bring probe card 302 into x- and y-axis alignment with the wafer. In addition, the z-axis offset between probe card 302 and the wafer may be determined from the z-axis difference in the captured images providing the highest of matches of the devices and the probes 881, respectively. If the z-axis offset is below a threshold value, probe card manipulator 120 may bring the probes 881 on probe card 302 into contact with the devices on the wafer, respectively. In some aspects, if the z-axis offset is above a threshold value, probe card manipulator 120 may bring the probes 881 on probe card 302 closer to the wafer along the z-axis direction. Within some aspects, to avoid crashing the probes 881 into the wafer, operation 1012 may be repeated at various z-axis movement intervals, to monitor the change in distance between the probes 881 and devices with respect to the movement of probe card 302 along the z-axis. Within some aspects, process 1000 may conclude once the probes 881 on probe card 302 are brought into physical and electrical contact with the devices on the wafer.

The operations or steps of FIGS. 7, 9, and 10 can be performed in any conceivable order and it is not required that all steps be performed. Moreover, the operations or steps of FIGS. 7, 9, and 10 described above merely reflect an example of steps and are not limiting. That is, further operations, steps, and functions are envisaged based aspects described in reference to FIGS. 1-6 and 8.

The foregoing disclosure outlines features of several aspects so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the aspects introduced herein. Those skilled in the art should also realize that such equivalent constructions do not depart from the spirit and scope of the present disclosure, and that they may make various changes, substitutions, and alterations herein without departing from the spirit and scope of the present disclosure.

It is to be understood that the phraseology or terminology herein is for the purpose of description and not of limitation, such that the terminology or phraseology of the present specification is to be interpreted by those skilled in relevant art(s) in light of the teachings herein.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. The foregoing description of specific aspects will so fully reveal the general nature of the present disclosure that others can, by applying knowledge within the skill of the art, readily modify and/or adapt for various applications such specific aspects, without undue experimentation and without departing from the general concept of the present disclosure. Therefore, such adaptations and modifications are intended to be within the meaning and range of equivalents of the disclosed aspects, based on the teaching and guidance presented herein.

It is to be understood that the Detailed Description section, and not the Summary and Abstract sections, is intended to be used to interpret the claims. The Summary and Abstract sections can set forth one or more, but not necessarily all, aspects of the present disclosure as contemplated by the inventor(s), and thus, are not intended to limit the present disclosure and the appended claims in any way. The breadth and scope of the protected subject matter should not be limited by any of the above-described aspects, but should be defined in accordance with the following claims and their equivalents.

What is claimed is:

1. A method for replacing a probe card in a test system, the method comprising:

moving, by a probe card manipulator, a used probe card from a measurement position to a replacement position;

moving, by a probe card exchanger, the used probe card from the replacement position to a cassette;

choosing a new probe card to replace the used probe card;

moving, by the probe card exchanger, the new probe card from the cassette to the replacement position;

engaging, by the probe card manipulator, the new probe card; and moving, by the probe card manipulator, the new probe card to the measurement position, wherein the new probe card comprises an array of flexible probes configured to flex or bend on physical contact with a device under test (DUT) to measure one or more electrical properties of the DUT by moving laterally along a surface of the DUT.

2. The method of claim 1, further comprising:

loading the cassette into a drawer unit of the test system.

3. The method of claim 1, wherein the choosing the new probe card comprises:

selecting the new probe card from the cassette according to a predetermined order.

4. The method of claim 1, wherein the choosing the new probe card comprises:

selecting the new probe card from the cassette according to one or more parameters of a wafer to be tested by the test system.

5. The method of claim 1, further comprising:

aligning, by the probe card manipulator, the new probe card with a registration plate; and testing the array of flexible probes in the new probe card using the registration plate.

6. The method of claim 5, wherein the aligning the new probe card with the registration plate comprises:

aligning a roll alignment of the new probe card with the registration plate;

aligning a yaw alignment of the new probe card with the registration plate;

aligning an x-axis alignment of the new probe card with the registration plate; and aligning a y-axis alignment of the new probe card with the registration plate.

7. The method of claim 6, wherein the aligning the roll alignment of the new probe card with the registration plate comprises:

positioning the new probe card with respect to a plurality of roll alignment pads on the registration plate;

determining if a first flexible probe in the array of flexible probes of the new probe card contacts a first one of the roll alignment pads; and determining if a last flexible probe in the array of flexible probes of the new probe card contacts a last one of the roll alignment pads.

8. The method of claim 7, further comprising:

adjusting the roll alignment of the new probe card in response to determining that the first flexible probe or the last flexible probe do not contact the first one or the last one of the roll alignment pads, respectively.

9. The method of claim 6, wherein the aligning the yaw alignment of the new probe card with the registration plate comprises:

positioning the new probe card with respect to a plurality of roll alignment pads on the registration plate; and determining if each flexible probe in the array of flexible probes of the new probe card either makes contact or loses contact with the respective roll alignment pad at about the same time.

10. The method of claim 9, further comprising:

adjusting the yaw alignment of the new probe card in response to determining that each flexible probe in the array of flexible probes of the new probe card does not make contact or lose contact with the respective roll alignment pad at about the same time.

11. The method of claim 6, wherein the aligning the x-axis alignment of the new probe card with the registration plate comprises:

positioning the new probe card with respect to a plurality of integrity test pads on the registration plate; and determining if each flexible probe in the array of flexible probes of the new probe card contacts a respective one of the integrity test pads.

12. The method of claim 11, further comprising:

adjusting the x-axis alignment of the new probe card in response to determining that each flexible probe in the new probe card does not contact a respective one of the integrity test pads.

13. The method of claim 6, wherein the aligning the y-axis alignment of the new probe card with the registration plate comprises:

positioning the new probe card with respect to a plurality of integrity test pads on the registration plate; and determining if the array of flexible probes in the new probe card is in alignment with a center of the integrity test pads along a y-direction.

14. The method of claim 13, wherein the determining if the array of flexible probes in the new probe card is aligned with the center of the integrity test pads along the y-direction comprises:

measuring a resistance of each flexible probe in the array of flexible probes of the new probe card.

15. The method of claim 13, wherein the determining if the array of flexible probes in the new probe card is aligned with the center of the integrity test pads along the y-direction comprises:

determining optically if each flexible probe in the array of flexible probes of the new probe card is in alignment with the integrity test pads along the y-direction.

16. The method of claim 13, further comprising:

adjusting the y-axis alignment of the new probe card in response to determining that each flexible probe in the array of flexible probes of the new probe card is not in alignment with the center of the integrity test pads along the y-direction.

17. The method of claim 5, wherein the testing the array of flexible probes in the new probe card using the registration plate comprises:

applying an electric current or an electric voltage to the registration plate to measure a resistance of each of the flexible probes.

18. The method of claim 17, further comprising:

moving the new probe card to the measurement position in response to determining that each of the flexible probes in the array of flexible probes of the new probe card is operational.

19. The method of claim 1, further comprising:

aligning, by a stage, a wafer to be tested by the test system with a predetermined alignment direction.

20. The method of claim 19, further comprising:

moving, by the probe card manipulator, the new probe card to contact the wafer.

21. A controller for a test system, the controller comprising:

a non-transitory memory comprising a set of instructions; and a processor, the processor being configured, upon receiving the set of instructions, to execute the steps of the method according to claim 1.

22. The controller of claim 21, wherein the processor is further configured to:
receive an indication of a loading of the cassette into a drawer unit;
in response to receiving the indication of the loading of the cassette, cause the drawer unit to close and lock; and
scan the cassette to identify one or more new probe cards in the cassette.

23. The controller of claim 21, wherein the processor is further configured to:
choose, from the probe cards in the cassette, a new probe card to replace a used probe card of a test system, wherein
the controller is configured to choose a new probe card according to a sequential usage order or according to one of more parameters of a device to be tested by the test system.

24. A probe card replacement station comprising:
a drawer unit comprising a cassette of probe cards;
a probe card exchanger configured to transfer the probe cards from the cassette to a probe card manipulator; and
a controller configured to choose, from the probe cards in the cassette, a new probe card to replace a used probe card of a test system, wherein the new probe card comprises an array of flexible probes configured to flex or bend on physical contact with a device under test (DUT) to measure one or more electrical properties of the DUT by moving laterally along a surface of the DUT.

25. The probe card replacement station of claim 24, wherein the probe card exchanger comprises one of a robotic arm, a linear actuator, and a conical connection.

26. The probe card replacement station of claim 24, wherein the cassette comprises a dummy probe card configured to calibrate one or more electrical components of the test system.

27. A test system comprising:
a probe card manipulator configured to move between a measurement position for measuring a wafer and a replacement position for replacing a used probe card of the test system;
a drawer unit comprising a cassette of probe cards;
a controller configured to choose, from the probe cards in the cassette, a new probe card to replace the used probe card, wherein the new probe card comprises an array of flexible probes configured to flex or bend on physical contact with a device under test (DUT) to measure one or more electrical properties of the DUT by moving laterally along a surface of the DUT; and
a probe card exchanger configured to transfer the new probe card from the cassette to the manipulator.

28. The test system of claim 27, further comprising:
a registration plate configured to test the array of flexible probes in the new probe card, wherein the registration plate comprises:
a plurality of roll alignment pads configured to check a roll alignment and a yaw alignment of the new probe card; and
a plurality of integrity test pads configured to check an x-axis alignment and a y-axis alignment of the new probe card.

29. The test system of claim 27, wherein the controller is further configured to:
determine, using a registration plate, that each of the flexible probes in the array of flexible probes of the new probe card is operational; and
in response to determining that each of the flexible probes in the array of flexible probes of the new probe card is operational, cause the probe card exchanger to move the new probe card to the replacement position.

30. A registration plate for a test system, the registration plate comprising:
a plurality of roll alignment pads configured to check a roll alignment and a yaw alignment of a probe card; and
a plurality of integrity test pads configured to check an x-axis alignment and a y-axis alignment of the probe card, wherein the probe card comprises an array of flexible probes configured to flex or bend on physical contact with a device under test (DUT) to measure one or more electrical properties of the DUT by moving laterally along a surface of the DUT.

* * * * *